(12) United States Patent
Kim et al.

(10) Patent No.: US 10,170,495 B2
(45) Date of Patent: Jan. 1, 2019

(54) STACKED MEMORY DEVICE, OPTICAL PROXIMITY CORRECTION (OPC) VERIFYING METHOD, METHOD OF DESIGNING LAYOUT OF STACKED MEMORY DEVICE, AND METHOD OF MANUFACTURING STACKED MEMORY DEVICE

(71) Applicants: Chang-Bum Kim, Seoul (KR);
Sung-Hoon Kim, Seongnam-si (KR);
Woo-Joung Kim, Seoul (KR);
Hyang-Ja Yang, Seoul (KR)

(72) Inventors: Chang-Bum Kim, Seoul (KR);
Sung-Hoon Kim, Seongnam-si (KR);
Woo-Joung Kim, Seoul (KR);
Hyang-Ja Yang, Seoul (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 15/402,258

(22) Filed: Jan. 10, 2017

(65) Prior Publication Data
US 2017/0250195 A1    Aug. 31, 2017

(30) Foreign Application Priority Data
Feb. 25, 2016   (KR) .......................... 10-2016-0022824

(51) Int. Cl.
*G06F 17/50*      (2006.01)
*H01L 27/11582*   (2017.01)
(Continued)

(52) U.S. Cl.
CPC .......... *H01L 27/11582* (2013.01); *G03F 1/36* (2013.01); *G06F 17/5081* (2013.01);
(Continued)

(58) Field of Classification Search
CPC .... G03F 1/36; G06F 17/5081; G06F 17/5045; G06F 17/50; G06F 17/5068;
(Continued)

(56) References Cited

U.S. PATENT DOCUMENTS 5,962,172 A * 10/1999 Nakao ................. G03F 7/70433
430/5
6,686,108 B2 * 2/2004 Inoue ....................... G03F 1/32
430/22
(Continued)

FOREIGN PATENT DOCUMENTS

JP    2003142584 A    5/2003
JP    4488727 B2      6/2010
(Continued)

*Primary Examiner* — Nghia Doan
(74) *Attorney, Agent, or Firm* — Volentine, Whitt & Francos, PLLC

(57) ABSTRACT

An optical proximity correction (OPC) verifying method including checking a first location of a first pattern in a layout of a stacked memory device, calculating a shift value of the first pattern according to the first location, obtaining a difference value between the first location and a second location of a second pattern formed through an OPC with respect to the first pattern, and determining whether the OPC is to be performed again, based on the shift value and the difference value.

18 Claims, 26 Drawing Sheets

(51) Int. Cl.
*G03F 1/36* (2012.01)
*H01L 21/027* (2006.01)
*H01L 27/11568* (2017.01)
*H01L 27/11573* (2017.01)
*H01L 27/11575* (2017.01)

(52) U.S. Cl.
CPC ...... *H01L 21/027* (2013.01); *H01L 27/11568* (2013.01); *H01L 27/11573* (2013.01); *H01L 27/11575* (2013.01)

(58) Field of Classification Search
CPC ... G06F 2217/12; G06T 7/0006; G11C 5/025; G11C 2029/3602
USPC .................................... 716/50–55; 430/5, 30
See application file for complete search history.

(56) References Cited

U.S. PATENT DOCUMENTS

| | | | |
|---|---|---|---|
| 6,871,338 B2 | 3/2005 | Yamauchi | |
| 7,194,704 B2 | 3/2007 | Kotani et al. | |
| 8,302,035 B2 | 10/2012 | Choi | |
| 8,327,225 B2 | 12/2012 | Jeddeloh | |
| 8,869,005 B2 | 10/2014 | Jeddeloh | |
| 2014/0199789 A1* | 7/2014 | Lee | H01L 22/12 438/7 |
| 2016/0124810 A1 | 5/2016 | Yang et al. | |

FOREIGN PATENT DOCUMENTS

| | | |
|---|---|---|
| KR | 10-2007-0078175 A | 7/2007 |
| KR | 10-2009-0099862 A | 9/2009 |
| KR | 10-2010-0073663 A | 7/2010 |
| KR | 10-2010-0135461 A | 12/2010 |
| KR | 101082103 B1 | 11/2011 |
| KR | 10-2012-0105045 A | 9/2012 |
| KR | 10-1508836 B1 | 4/2015 |
| KR | 10-1566639 B1 | 11/2015 |

\* cited by examiner

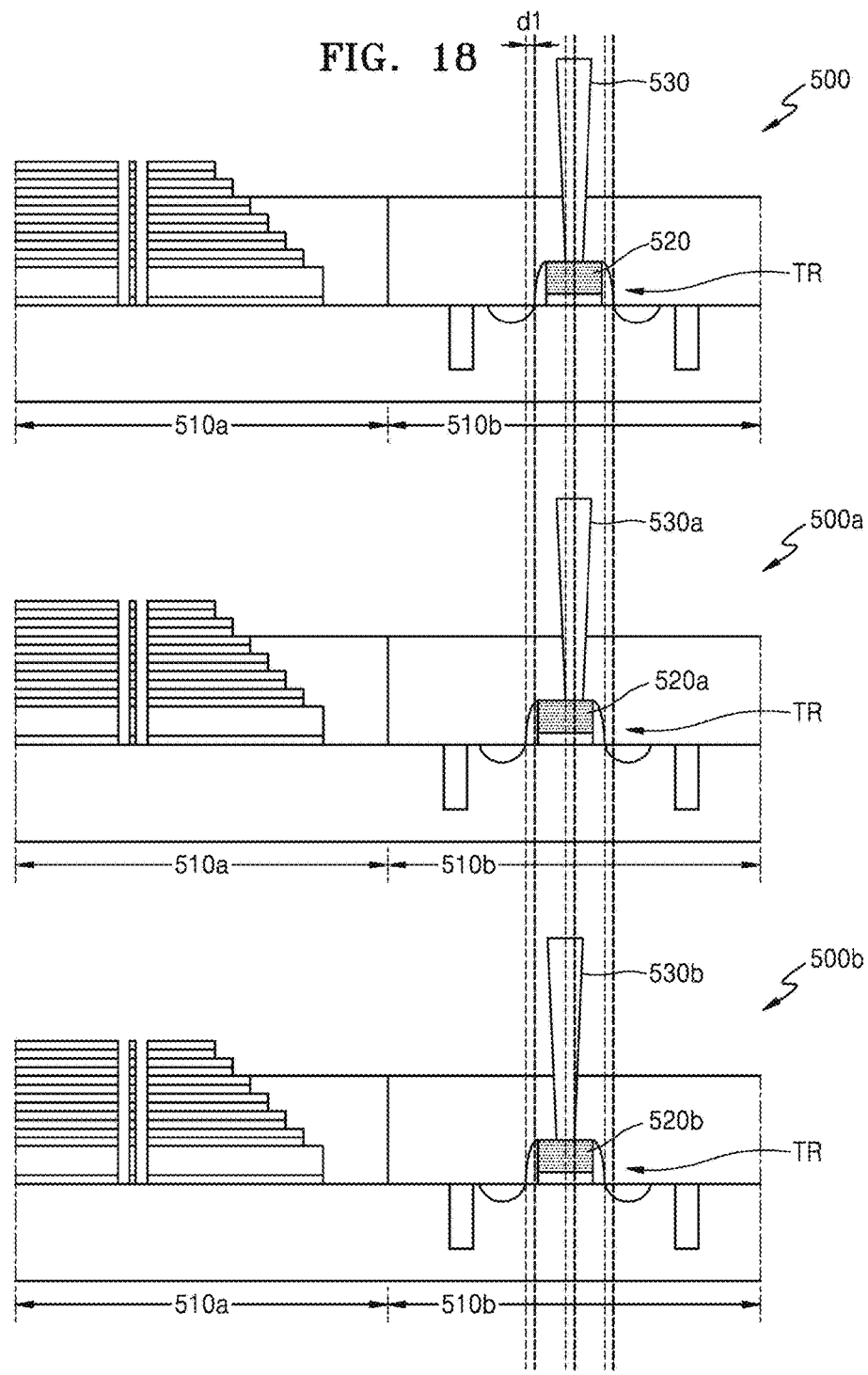

US 10,170,495 B2

STACKED MEMORY DEVICE, OPTICAL PROXIMITY CORRECTION (OPC) VERIFYING METHOD, METHOD OF DESIGNING LAYOUT OF STACKED MEMORY DEVICE, AND METHOD OF MANUFACTURING STACKED MEMORY DEVICE

CROSS-REFERENCE TO RELATED APPLICATION

This application claims the benefit of priority under 35 U.S.C. § 119 to Korean Patent Application No. 10-2016-0022824, filed on Feb. 25, 2016, in the Korean Intellectual Property Office, the disclosure of which is incorporated herein in its entirety by reference.

BACKGROUND

Field of the Disclosure

The present disclosure relates to a memory device. More particularly, the present disclosure relates to a stacked memory device, an optical proximity correction (OPC) verifying method, a method of designing a layout of a memory device, and a method of manufacturing a stacked memory device.

Background Information

Memory devices are used to store data, and are classified into a volatile memory device and a nonvolatile memory device. A flash memory device as an example of a nonvolatile memory device may be used in a mobile phone, a digital camera, a portable digital assistant (PDA), a mobile computer device, a fixed computer device, and other devices. Stacked memory devices have been developed due to the need for small, high capacity nonvolatile memory devices. The stacked memory device refers to a memory device that includes multiple memory cells or memory cell arrays vertically stacked on a substrate. A peripheral circuit area of the stacked memory device may be influenced by a process of forming the memory cell arrays. As a result, a semiconductor chip by which the stacked memory device is implemented may fail.

SUMMARY

According to an aspect of the present disclosure, an optical proximity correction (OPC) verifying method includes checking a first location of a first pattern in a layout of a stacked memory device. The OPC verifying method also includes calculating a shift value of the first pattern according to the first location. The OPC verifying method further includes obtaining a difference value between the first location and a second location of a second pattern formed through an OPC with respect to the first pattern. The OPC verifying method moreover includes determining whether the OPC is to be performed again, based on the shift value and the difference value.

According to another aspect of the present disclosure, a method of designing a layout of a stacked memory device includes checking a first location of a first pattern in an initial layout of a stacked memory device. The method also includes calculating a shift value of the first pattern according to the first location. The method further includes obtaining a difference value between the first location and a second location of a second pattern formed through a first optical proximity correction (OPC) with respect to the first pattern. The method moreover includes determining whether a second OPC is to be performed, based on the shift value and the difference value. A final layout of the stacked memory device is generated based on the second pattern or a third pattern formed through the second OPC.

According to another aspect of the present disclosure, a method of manufacturing a stacked memory device includes designing a layout of the stacked memory device. The method also includes calculating a shift value of a first pattern according to a first location of the first pattern in the layout. The method further includes obtaining a difference value between the first location and a second location of a second pattern formed through a first OPC with respect to the first pattern. The method moreover includes determining whether a second OPC is to be performed, based on the shift value and the difference value. A mask is formed based on the second pattern or a third pattern formed through the second OPC. The stacked memory device is formed through a lithographic process using the mask.

According to another aspect of the present disclosure, a stacked memory device includes a memory cell array that includes multiple memory cells respectively connected to multiple word lines vertically stacked on a substrate. The stacked memory device also includes a peripheral circuit arranged adjacent to the memory cell array in a first direction. The peripheral circuit includes multiple transistors electrically connected to the memory cell array. Locations of contacts respectively connected to first transistors of the transistors in the first direction are substantially the same. Distances of the first transistors from the memory cell array are the same.

According to another aspect of the present disclosure, a stacked memory device includes a memory cell array that includes multiple memory cells respectively connected to multiple word lines vertically stacked on a substrate. The stacked memory device also includes a peripheral circuit arranged adjacent to the memory cell array in a first direction. The peripheral circuit includes transistors electrically connected to a first area of the memory cell array and transistors electrically connected to a second area of the memory cell array. First locations of first contacts respectively connected to first transistors of the transistors electrically connected to the first area in the first direction are substantially the same. Distances of the first transistors from the memory cell array are the same. Second locations of second contacts respectively connected to second transistors of the transistors electrically connected to the second area in the first direction are substantially the same. Distances of the second transistors from the memory cell array are the same. When the distance from the memory cell array to the first transistors is the same as the distance from the memory cell array to the second transistors. The first and second locations are different.

According to another aspect of the present disclosure, a stacked memory device includes a memory cell array that includes multiple memory cells respectively connected to multiple word lines vertically stacked on a substrate. The stacked memory device also includes a peripheral circuit arranged adjacent to the memory cell array in a first direction. The peripheral circuit includes multiple transistors electrically connected to the memory cell array. Locations of contacts respectively connected to first transistors of the multiple transistors along a second direction are substantially the same. Locations of the first transistors along the second direction are the same. The second direction is substantially perpendicular to the first direction.

BRIEF DESCRIPTION OF THE DRAWINGS

Embodiments of the present disclosure will be more clearly understood from the following detailed description taken in conjunction with the accompanying drawings in which:

FIG. 18 is sectional views illustrating stacked memory devices according to an embodiment;

DETAILED DESCRIPTION OF THE EMBODIMENTS

Figure 1:
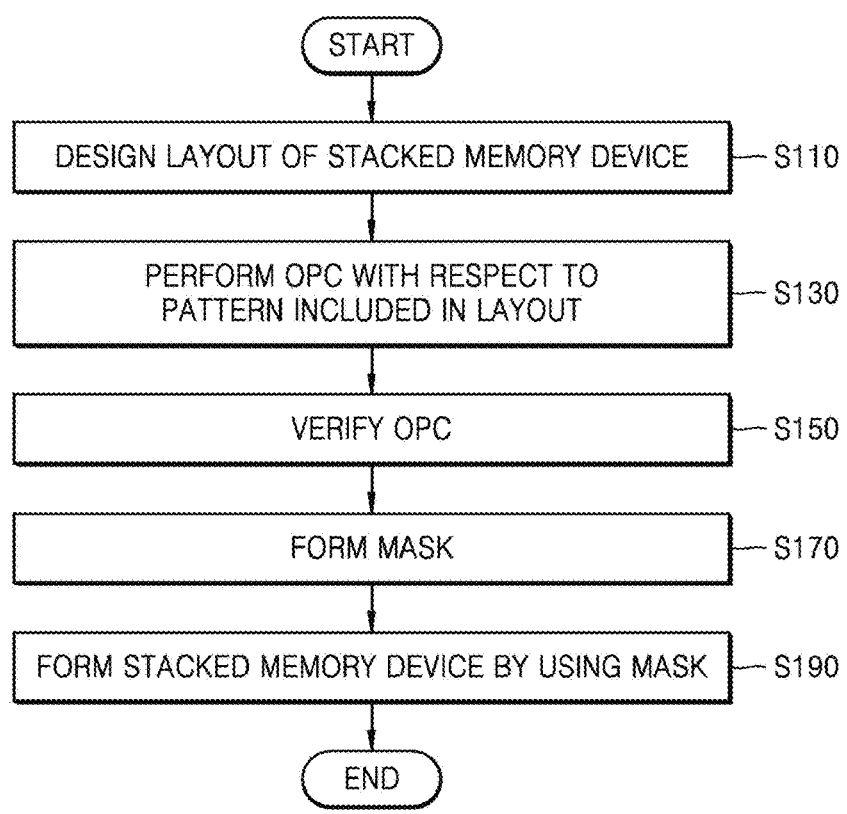
FIG. 1 is a flowchart of a method of manufacturing a stacked memory device according to an embodiment.

FIG. 1 is a flowchart of a method of manufacturing a stacked memory device according to an embodiment.

Referring to FIG. 1, in operation S110, a layout of a stacked memory device is designed. Here, the layout is a physical indication through which a circuit designed for a stacked memory device may be transferred onto a wafer, and may include multiple patterns. In the specification, the layout may be referred to as "an initial layout" or "an original layout". Here, the pattern may correspond to a circuit, an interconnection, or the like that is directly associated with an operation of the stacked memory device. Herein, in the present specification, the pattern included in the initial layout will be referred to a first pattern. In an embodiment, the first pattern may include a contact pattern arranged in a peripheral circuit area of the stacked memory device. However, the layout of the stacked memory device is not limited thereto, and the first pattern may include a conductive layer pattern or an insulating layer pattern.

Herein, the stacked memory device refers to a memory device that includes multiple memory cells or memory cell arrays vertically stacked on a substrate. In an embodiment, the stacked memory device may be a vertical channel type memory device that includes memory cells respectively connected to word lines vertically stacked on the substrate. In an embodiment, the stacked memory device may be a cross point memory device in which word lines and bit lines are alternately stacked on a substrate and including memory cells arranged in areas in which word lines and bit lines cross each other. However, the stacked memory device is not limited thereto.

Memory cell arrays, memory cells and memory described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period of time. The term "non-transitory" specifically disavows fleeting characteristics such as characteristics of a particular carrier wave or signal or other forms that exist only transitorily in any place at any time. A memory cell array, memory cell, or memory described herein is an article of manufacture and/or machine component. Memory cell arrays, memory cells, and memories described herein are computer-readable mediums from which data and executable instructions can be read by a computer.

In operation S130, optical proximity correction (OPC) is performed on patterns included in the layout. Optical proximity correction (OPC) is a technique for correcting image errors due, for example, to diffraction, in photolithography. The OPC may be performed by an OPC tool, and, for example, the OPC tool may receive layout data in graphic database system (GDS) format. The OPC tool may convert the layout data into data corresponding to the OPC. For example, the OPC tool may be a software module that includes multiple instructions executable on a processor, and may be stored in a non-transitory computer-readable storage medium.

In detail, a second pattern may be formed by performing the OPC on the first pattern included in the layout. Herein, the second pattern may refer to a pattern formed by performing the OPC. Here, the OPC refers to an operation of changing patterns included in the layout by reflecting an error due to an optical proximity effect (OPE). As the pattern becomes finer, an OPE due to influences between adjacent patterns may occur during an exposure process. Accordingly, an OPE may be restrained by performing the OPC that corrects a pattern layout on a mask to which a pattern is transferred.

In operation S150, the OPC is verified. The OPC may be verified by an OPC verifying tool. The OPC verifying tool may receive layout data and OPC data and may verify the OPC. For example, the OPC verifying tool may be a software module that includes multiple instructions executable on a processor, and may be stored in a non-transitory computer-readable storage medium.

In the present embodiment, a shift value for the first pattern included in the layout may be calculated according to the location of the first pattern. A determination may be made whether the OPC will be repeated (performed again) based on the shift value and a difference value between the location of the first pattern and the location of the second pattern. Then, the shift value may be a predicted shift value calculated based on experience such as from previous calculations and determinations. In an embodiment, a calculation equation used to calculate a shift value for the first pattern may be different according to the location of the first pattern. Accordingly, a misalignment of a contact formed along the second pattern may be prevented, and thus a potential failure of a semiconductor chip in which the stacked memory device is implemented may be prevented.

In operation S170, a mask is formed. In an embodiment, the mask may be used to form a contact in a peripheral circuit area of the stacked memory device. In detail, the mask may be formed by performing an exposure process on a substrate for a mask by using the second pattern or a third pattern formed through re-performance of the OPC. Herein, the third pattern may refer to a pattern formed by performing the secondary OPC.

In operation S190, the stacked memory device is formed by using the mask. The stacked memory device is formed by performing various semiconductor processes on a semiconductor substrate such as a wafer by using the mask. For example, the process using the mask may refer to a patterning process performed through a lithographic process. A desired pattern may be formed on a semiconductor substrate or a material layer through the patterning process. In an embodiment, the desired pattern may be a contact in a peripheral circuit area of the stacked memory device.

Figure 2:
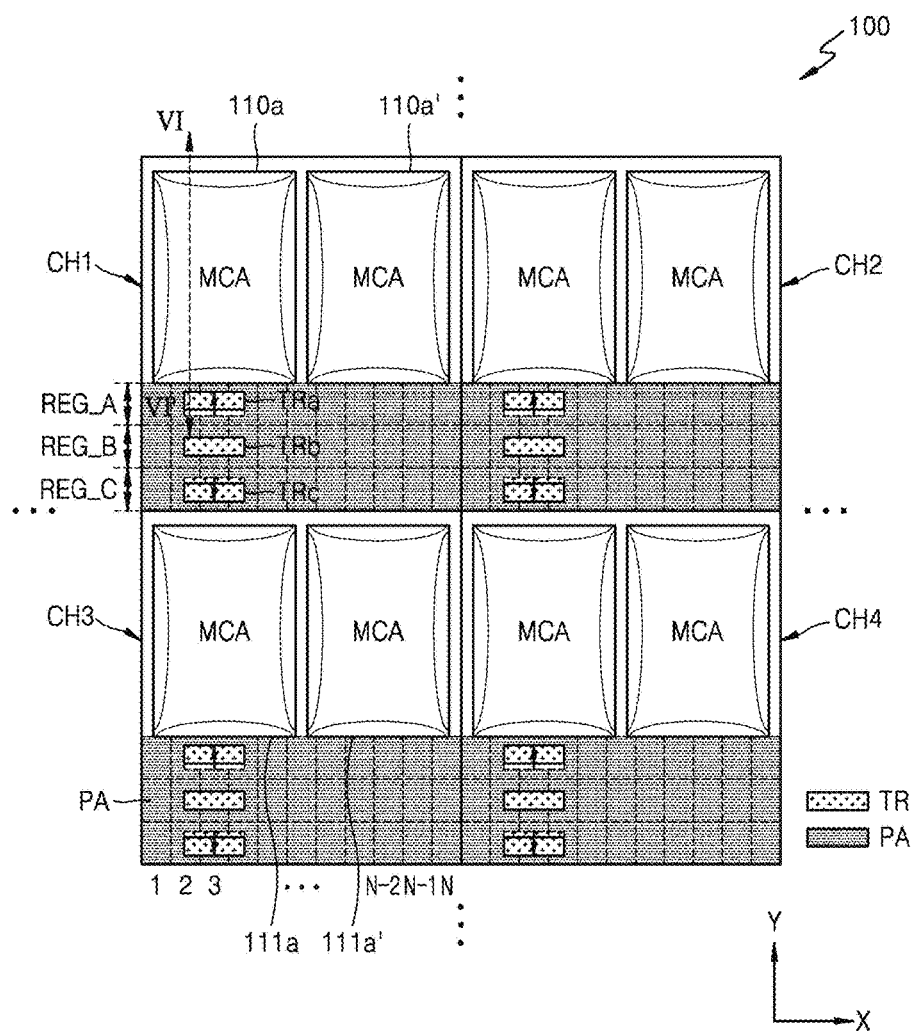
FIG. 2 is a layout of a stacked memory device according to an embodiment.

FIG. 2 is a layout 100 of a stacked memory device according to an embodiment.

Referring to FIG. 2, the layout 100 may include multiple adjacent semiconductor chips CH1 to CH4. A stacked memory device may be implemented in each of the semiconductor chips CH1 to CH4. The first and second semiconductor chips CH1 and CH2 are adjacent to each other in the X direction, and the third and fourth semiconductor chips CH3 and CH4 are adjacent to each other in the X direction. The first and third semiconductor chips CH1 and CH3 are adjacent to each other in the Y direction, and the second and fourth semiconductor chips CH2 and CH4 are adjacent to each other in the Y direction.

The first semiconductor chip CH1 may include memory cell array areas 110a and 110a' and a peripheral circuit area PA. The peripheral circuit area PA may be adjacent to the memory cell array areas 110a and 110a' in the first direction. In an embodiment, the first direction may be the Y direction. However, the first semiconductor chip CH1 is not limited thereto, and the peripheral circuit area PA may be adjacent to the memory cell array areas 110 in the X direction.

The peripheral circuit area PA may be classified into multiple regions according to the locations thereof. In an embodiment, the peripheral circuit area PA may be classified into first to third regions REG_A, REG_B, and REG_C along the Y direction. The peripheral circuit area PA may have a row decoder, a page buffer, a latch circuit, a cache circuit, a column decoder, a detection amplifier or a data input/output circuit. The second to fourth semiconductor chips CH2 to CH4 are implemented in the same manner as that of the first semiconductor chip CH1. The first semiconductor chip CH1 will be mainly described below.

The memory cell array areas 110 may be defined as active areas in which the memory cell arrays are arranged. Although it is illustrated that the first semiconductor chip CH1 includes two memory cell array areas 110a and 110a', the first semiconductor chip CH1 is not limited thereto. The number of the memory cell array areas included in the first semiconductor chip CH1 may be varied.

Figure 3:
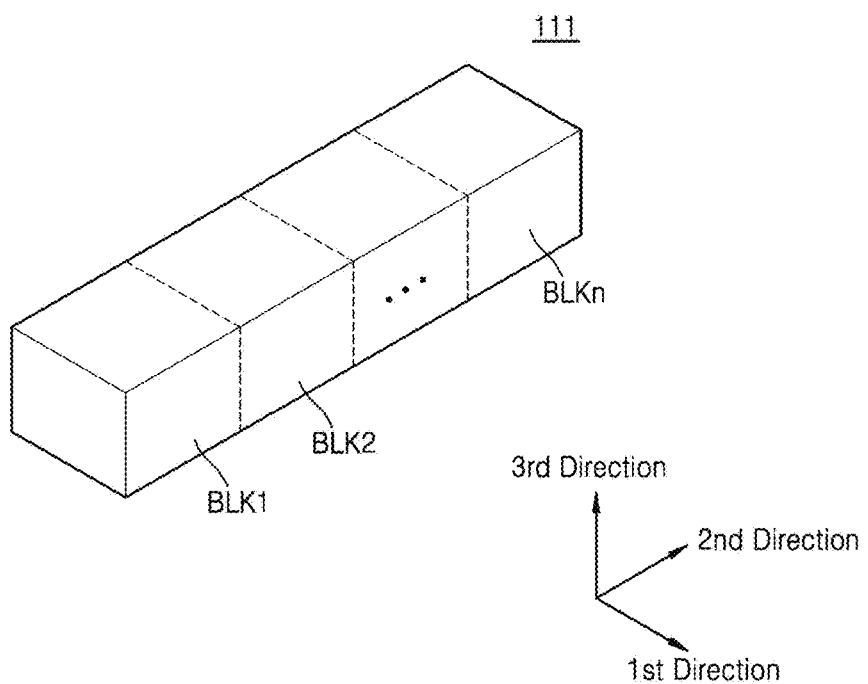
FIG. 3 illustrates a memory cell array according to an embodiment.

FIG. 3 illustrates a memory cell array 111 according to an embodiment.

Referring to FIG. 3, the memory cell array 111 includes multiple memory blocks BLK1 to BLKn and each of the memory blocks BLK1 to BLKn may have a 3-dimensional (3D) structure (or a vertical structure). Thus, the memory cell array MCA may be referred to as a 3D memory cell array. For example, the memory cell array 111 may be arranged in each of the memory cell areas 110a and 110a' of FIG. 2.

In an embodiment, the 3D memory cell array is monolithically formed at at least one physical level of the memory cell arrays having an active area and a circuit. The active area is arranged on a silicon substrate. The circuit is formed on or in the substrate as a circuit associated with operations of the memory cells. The term "monolithically" means that layers of the levels constituting the array are laminated immediately on the layers of the levels located under the array.

In an embodiment, the 3D memory cells array includes NAND strings vertically arranged such that at least one memory cell is situated on another memory cell. The at least one memory cell may include a charge trap layer. U.S. Pat. No. 7,679,133, U.S. Pat. No. 8,553,466, U.S. Pat. No. 8,654,587, U.S. Pat. No. 8,559,235, and U.S. Patent Application Publication No. 2011/0233648 disclose suitable configurations of 3D memory arrays which include multiple levels and in which word lines and/or bit lines are shared by the levels, and are incorporated herein by reference.

Figure 4:
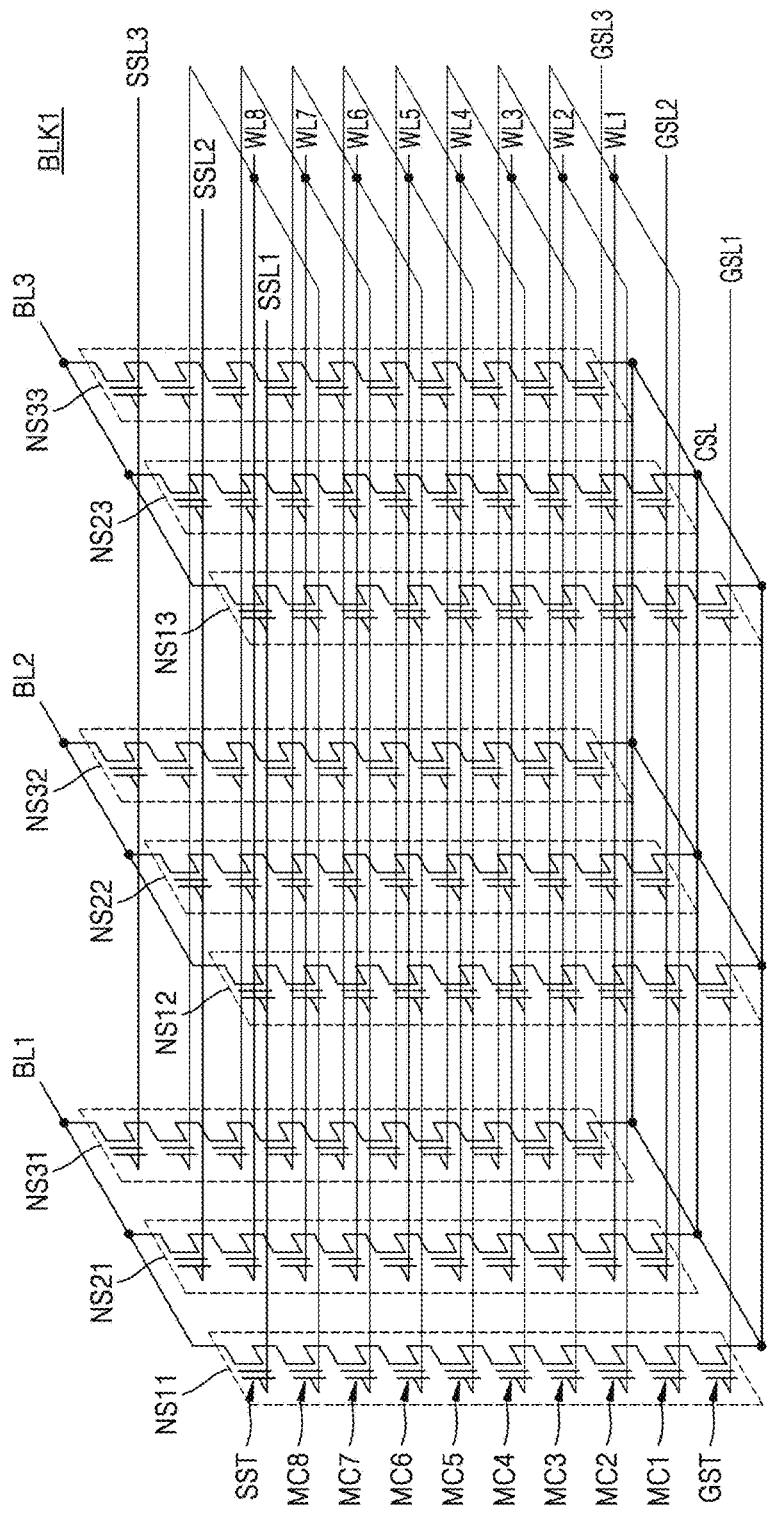
FIG. 4 is a circuit diagram of an equivalent circuit of the first memory block, which is one of the memory blocks included in the memory cell array of FIG. 3.

FIG. 4 is a circuit diagram of an equivalent circuit of the first memory block BLK1, which is one of the memory blocks included in the memory cell array 111 of FIG. 3.

Referring to FIG. 4, the first memory block BLK1 may include multiple NAND strings NS11 to NS33, multiple word lines WL1 to WL8, multiple bit lines BL1 to BL3, multiple ground selection lines GSL1 to GSL3, multiple string selection lines SSL1 to SSL3, and a common source line CSL. Here, the number of the NAND strings, the number of the word lines, the number of the bit lines, the number of the ground selection lines, and the number of the string selection lines may vary according to embodiments.

Figure 5:
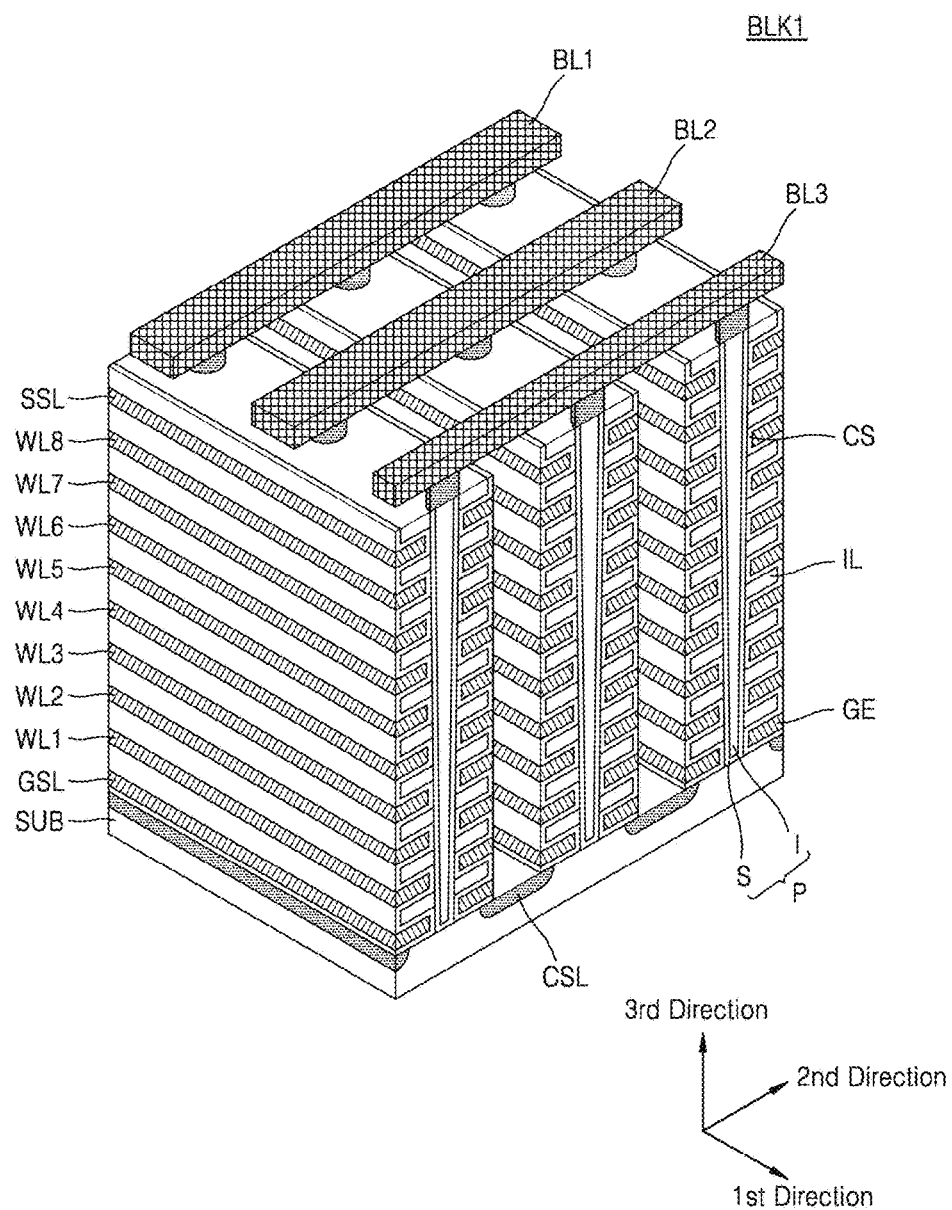
FIG. 5 is a perspective view of the first memory block of FIG. 4.

FIG. 5 is a perspective view of the first memory block BLK1 of FIG. 4.

Referring to FIG. 5, the first memory block BLK1 is formed in a direction perpendicular to the substrate SUB. Although FIG. 5 illustrates that the first memory block BLK1 includes two selection lines GSL and SSL, eight word lines WL1 to WL8, and three bit lines BL1 to BL3, the number thereof may be larger or smaller.

Referring back to FIG. 2, when the memory blocks BLK1 to BLKn illustrated in FIGS. 3 to 5 are formed in the memory cell array area MCA of each of the semiconductor chips CH1 to CH4, the silicon substrate corresponding to the peripheral circuit area PA may be shifted to the memory cell array area MCA. Accordingly, a device (for example, a transistor) formed in the silicon substrate in advance may be shifted towards the memory cell array area MCA as compared with the pattern included in the initial layout. A misalignment may occur between the device and a contact which is to be formed on the device. This will be described in detail below with reference to FIGS. 6A to 6F.

FIGS. 6A to 6F are sectional views illustrating an example of a method of manufacturing a stacked memory device according to an embodiment. FIGS. 6A to 6F may correspond to an example of operation S190 of FIG. 1, and may correspond to a sectional view taken along a line VI-VI' of FIG. 2.

Figure 6A:
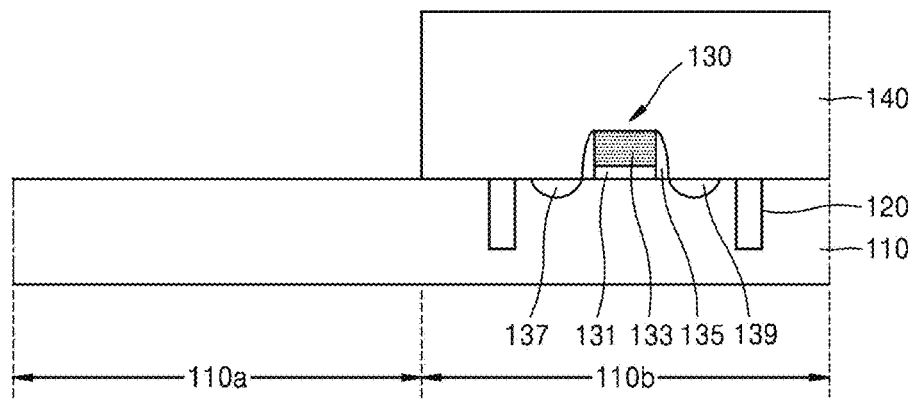
FIGS. 6A to 6F are sectional views illustrating an example of a method of manufacturing a stacked memory device according to an embodiment.

Referring to FIG. 6A, an active area is defined by forming a device separating film 120 on a substrate 110. Here, the substrate 110 may be a semiconductor substrate. The substrate 110 may be divided into a memory cell array area 110a and a peripheral circuit area 110b. For example, the memory cell array area 110a may correspond to the memory cell array area 110a of FIG. 2. The peripheral circuit area 110b may correspond to the peripheral circuit area PA of FIG. 2.

Subsequently, a transistor 130 is formed on the peripheral circuit area 110b of the substrate 110. The transistor 130 includes a gate structure including a gate insulator 131, a gate electrode 133, and a spacer 135. The transistor 130 also includes a source area 137 and a drain area 139 arranged on opposite sides of the gate structure. Herein, the process of forming the transistor 130 on the peripheral circuit area 110b may be referred to as "a front-end layer forming process".

Figure 6B:
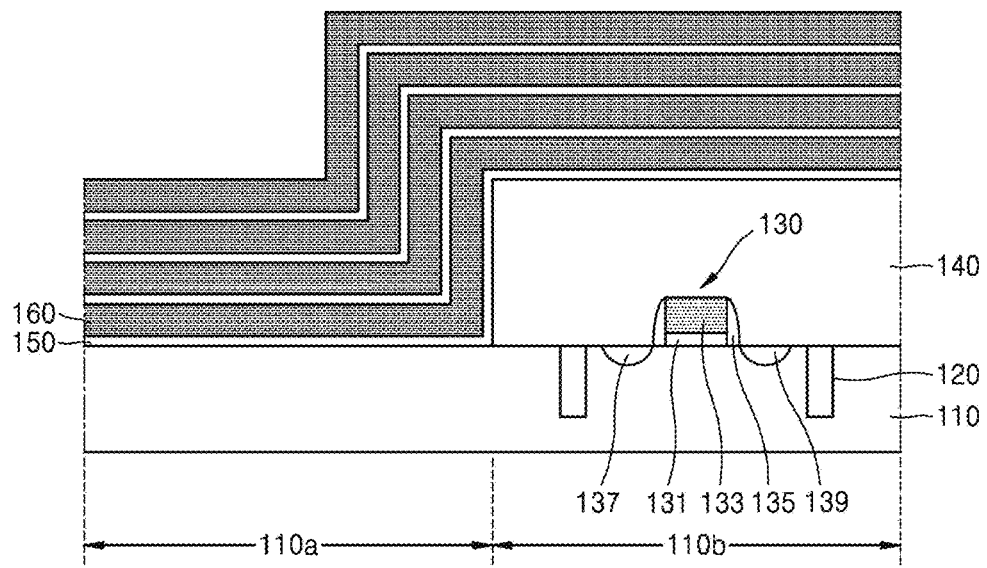

Referring to FIG. 6B, interlayer insulating films 150 and sacrificial films 160 are repeatedly alternately laminated to form the mold structure. The sacrificial films 160 have an etch selectivity with respect to the interlayer insulating films 150, and may be formed of a material that is easily removed through a wet etching process. The sacrificial films 160 may be removed through a following process to provide a space in which a ground selection line, word lines, and a string selection line are formed.

Figure 6C:
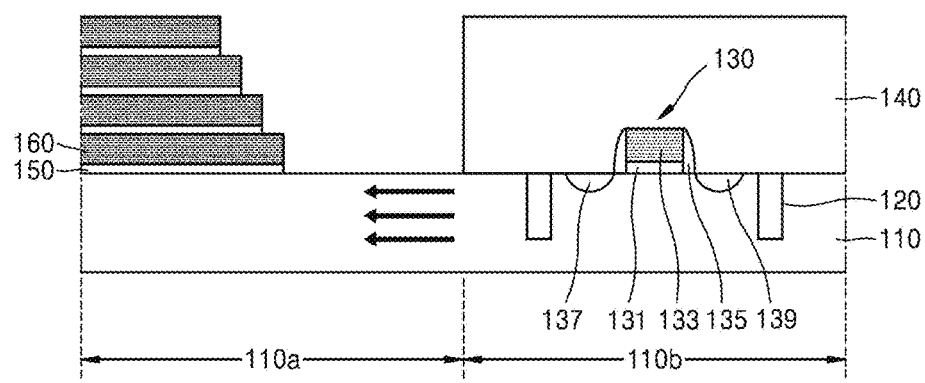

Referring to FIG. 6C, a stepped mold structure is formed by partially etching the interlayer insulating films 150 and the sacrificial films 160. Accordingly, the interlayer insulating films 150 and the sacrificial films 160 may be removed from the peripheral circuit area 110b. The processes illustrated in FIGS. 6A to 6C may be performed, for example, at about 650° C. for 30 minutes.

The substrate 110 may be stressed (hereinafter, referred to as "mold stress") by a process of forming the stepped mold structure of FIGS. 6B and 6C. Accordingly, the peripheral circuit area 110b of the substrate 110 may be shifted towards the memory cell array area 110a. Accordingly, through a process of forming the front-end layer of FIG. 6A, the transistor 130 formed in the peripheral circuit area 110b in advance may be shifted towards the memory cell array area 110a.

Figure 6D:
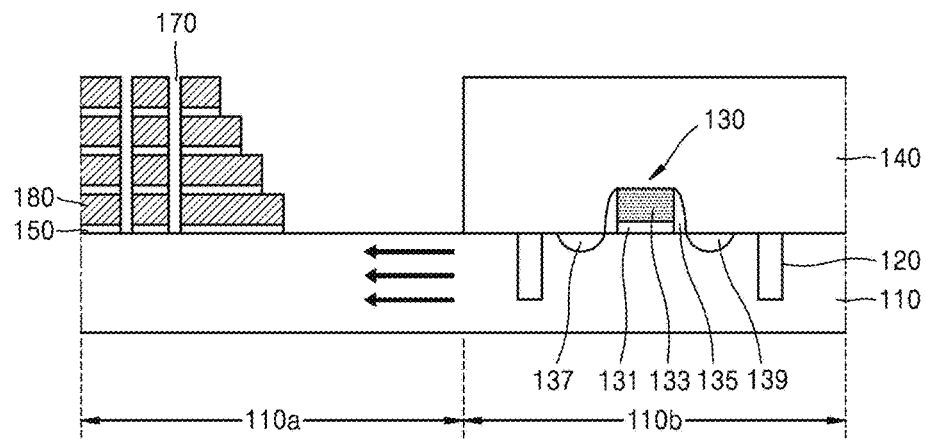

Referring to FIG. 6D, multiple channel holes 170 passing through the interlayer insulating films 150 and the sacrificial films 160 may be formed. Further, a charge storage film structure is formed on side walls of the channel holes 170. Further, the sacrificial films 160 may be removed, and multiple gate electrodes 180 may be formed. Herein, a process of forming a 3D memory cell array on the memory cell array area 110a may be referred to as "a cell array forming process". The cell array forming process may be performed, for example, at a temperature of about 850° C. for about 30 minutes.

The substrate 110 may be stressed (hereinafter, referred to as "channel hole stress") by a process of forming the cell array of FIG. 6D. Accordingly, the peripheral circuit area 110b of the substrate 110 may be shifted towards the memory cell array area 110a. Thus, through a process of forming the front-end layer of FIG. 6A, the transistor 130 formed in the peripheral circuit area 110b in advance may be shifted towards the memory cell array area 110a.

Figure 6E:
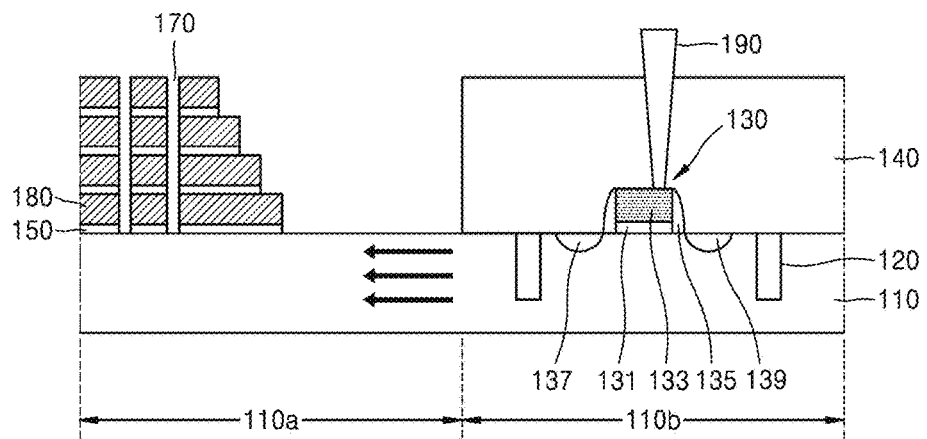

Referring to FIG. 6E, a gate contact 190 is formed on the transistor 130 in the peripheral circuit area 110b of the substrate 110. The process may be referred to as "a contact forming process". Then, the gate contact 190 may be formed by using a mask formed along a first pattern included in the layout or a second pattern formed through the OPC. When the gate contact 190 is formed by using the formed mask without considering the shift of the transistor 130 due to the aforementioned mold stress or channel hole stress, the gate contact 190 may sometimes not be aligned with the gate electrode 133.

Figure 6F:
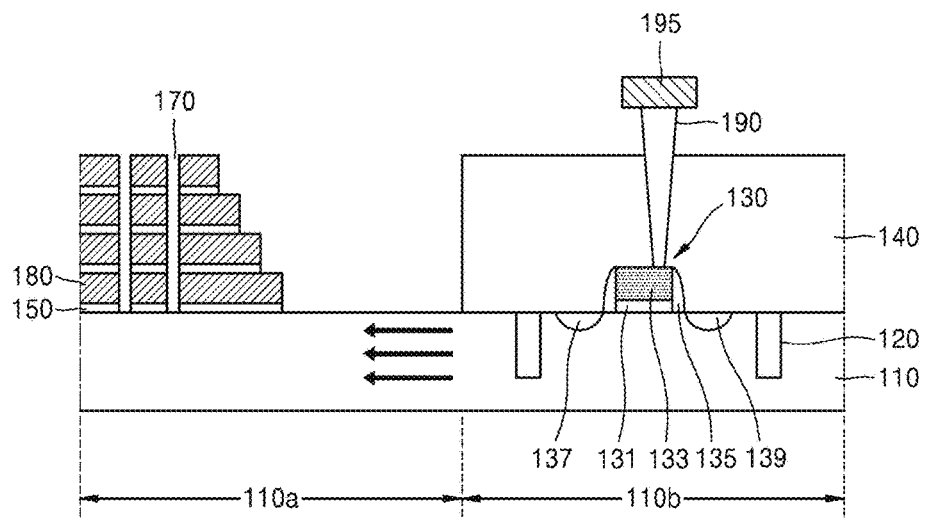

Referring to FIG. 6F, a metallic layer 195 is formed on the gate contact 190. The process may be referred to as "a back-end layer forming process". The gate electrode 133 and the metallic layer 195 may not be properly connected to each other due to a misalignment between the gate contact 190 and the gate electrode 133 of FIG. 6E. Accordingly, the semiconductor chip (for example, CH1 of FIG. 2) in which the stacked memory device is formed may experience a failure.

As has been described with reference to FIGS. 6A to 6F, the stacked memory device may be formed by, first, performing a front-end layer forming process, then performing a cell array forming process, then performing a process of forming a contact in the peripheral circuit area 110b, and then performing a back-end layer forming process. Then, the transistor 130 of the peripheral circuit area 110b formed in the front end layer forming process may be shifted to the memory cell array area 110a by the mold stress or the channel hole stress during a cell array forming process. Accordingly, a misalignment may be caused by the contact 190 electrically connecting the front-end layer and the back-end layer, which may cause a failure of the semiconductor chip in which the stacked memory device is formed.

Meanwhile, FIGS. 6A to 6F exemplarily illustrate that the peripheral circuit area 110b that is adjacent to the memory cell array area 110a in the Y direction is shifted to the memory cell array area 110a, that is, in the Y direction, by the mold stress or the channel hole stress during the cell array forming process. However, the arrangement of the peripheral circuit area 110b and memory cell array area 110a is not limited thereto. The peripheral circuit area that is adjacent to the memory cell array area 110a in the X direction also may be stressed by the mold stress or channel hole stress during the cell array forming process, and accordingly, may be shifted in the Y direction. Even in the peripheral circuit area that is adjacent to the memory cell array 110a in the X direction, a misalignment may be caused by a contact that electrically connects the front-end layer and the back-end layer, which may cause a failure of the semiconductor chip in which the stacked memory device is formed.

Figure 7:
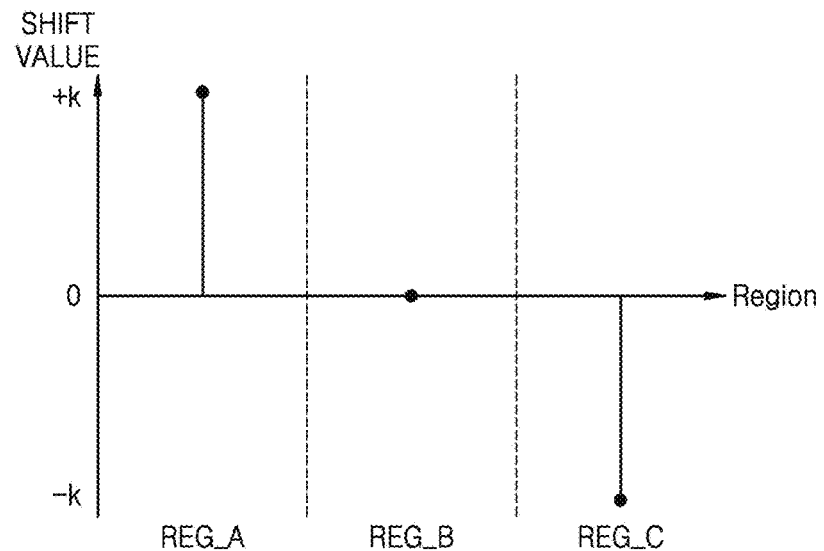
FIG. 7 is a graph depicting shift values according to regions in a peripheral circuit area included in the stacked memory device of FIG. 2.

FIG. 7 is a graph depicting shift values according to regions in the peripheral circuit area PA included in the stacked memory device of FIG. 2.

Referring to FIG. 7, the transverse axis represents regions in the peripheral circuit area PA. The longitudinal axis represents shift values of the silicon substrate corresponding to the regions. In the present embodiment, the peripheral circuit area PA may be divided into first to third regions REG_A to REG_C along the Y direction.

The first region REG_A is closest to the memory cell array areas 110a and 110a' of the first semiconductor chip CH1. Accordingly, the first region REG_A may be shifted towards the memory cell array areas 110a and 110a' of the first semiconductor chip CH1 due to the stress from the memory cell array areas 110 of the first semiconductor chip CH1 in the cell array forming process. Accordingly, the shift value corresponding to the first region REG_A may correspond to +k, and the transistor TRa arranged in the first region REG_A may be shifted towards the memory cell array areas 110 of the first semiconductor chip CH1 by k.

The third region REG_C is farthest from the memory cell array areas 110 of the first semiconductor chip CH1, but is closest to the memory cell array areas 111a and 111a' of the third semiconductor chip CH3. Accordingly, the third region REG_C may be shifted towards the memory cell array areas 111a and 111a' of the third semiconductor chip CH3 due to the stress from the memory cell array areas 111a and 111a' of the third semiconductor chip CH3 in the cell array forming process. Accordingly, the shift value corresponding to the third region REG_C may correspond to −k, and the transistor TRc arranged in the third region REG_C may be shifted towards the memory cell array areas 111a and 111a' of the third semiconductor chip CH3 by k.

In relation to the second region REG_B, the distance between the memory cell array areas 110a and 110a' of the first semiconductor chip CH1 and the second region REG_B may be substantially the same as the distance between the memory cell array areas 111a and 111a' of the third semiconductor chip CH3 and the second region REG_B. Substantially the same stress may be applied from the memory cell array areas 110a and 110a' of the first semiconductor chip CH1 and the memory cell array areas 111a and 111a' of the third semiconductor chip CH3 to the second region REG_B. Accordingly, the shift value corresponding to the second region REG_B may correspond to 0, and the transistor TRb arranged in the second region REG_B may not be shifted.

According to embodiments, a calculation equation for calculating the shift values of the patterns on the peripheral circuit area may be established based on the graph of FIG. 7. In detail, a calculation equation for calculating the shift values of the patterns may be established based on the distances between the patterns and the memory cell array area of the corresponding semiconductor chip and the distance between the memory cell array areas of the adjacent semiconductor chips.

In the graph of FIG. 7, the peripheral circuit area PA is divided into three regions, but the peripheral circuit area PA is not limited thereto. In an embodiment, the peripheral circuit area PA may be divided into a higher number of regions along the Y direction. Then, the shift values of the patterns may be calculated by using different calculation equations for different regions. In an embodiment, the peripheral circuit area PA may be divided into two regions with respect to a reference line in the Y direction. For example, the shift direction of the patterns arranged on the reference line of the peripheral circuit area PA may be determined to be a positive direction. The shift direction of the patterns arranged under the reference line may be determined to be a negative direction.

Meanwhile, in some embodiments, the peripheral circuit area PA is not necessarily divided into multiple regions. In an embodiment, all the shift directions of the patterns included in the peripheral circuit area PA may be determined to be a positive direction. In an embodiment, all the shift values of the patterns included in the peripheral circuit area PA may be determined to have a specific value in a positive direction. In an embodiment, all the shift directions of the patterns included in the peripheral circuit area PA may be determined to be a negative direction. In an embodiment, all the shift values of the patterns included in the peripheral circuit area PA may be determined to have a specific value in a negative direction.

Meanwhile, although the shift values according to the regions in the peripheral circuit area PA of the first semiconductor chip CH1 of FIG. 2 have been described, the shift values are not limited thereto. The shift values may be different as in FIG. 7 according to regions, even in the peripheral circuit area adjacent to the first semiconductor chip CH1 in the X direction.

Figure 8:
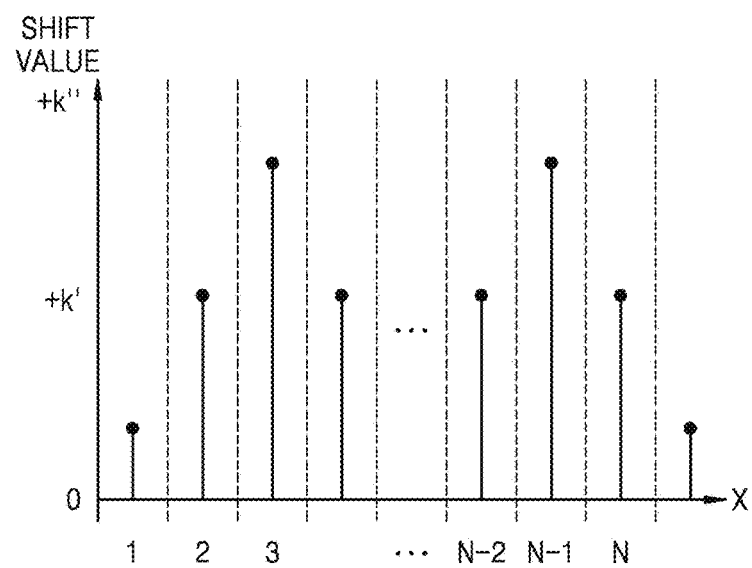
FIG. 8 is a graph depicting shift values according to locations in an X direction in a first area of the peripheral circuit area PA included in the stacked memory device of FIG. 2.

FIG. 8 is a graph depicting shift values according to locations in the X direction in the first region REG_A of the peripheral circuit area PA included in the stacked memory device of FIG. 2.

Referring to FIG. 8, the transverse axis represents locations in the X direction in the first region REG_A. The longitudinal axis represents shift values of the silicon substrate corresponding to the locations. In the present embodiment, the locations of the first region REG_A in the X direction may be indicated by 1 to N.

Location 1 in the X direction may correspond to an edge area of a first memory cell array area 110a. Location 3 in the X direction may correspond to a central area of the first memory cell array area 110a. In this way, from the edge area towards the center of the first memory cell array area 110a, the shift values of the silicon substrate for the locations in the X direction may increase. Accordingly, a transistor corresponding to location 3 in the X direction may be shifted closer to the first memory cell array area 110a than a transistor corresponding to location 1 in the X direction.

Meanwhile, location N−2 in the X direction may correspond to a central area of a second memory cell array area 110a'. Location N in the X direction may correspond to an edge area of the second memory cell array area 110a'. In this way, from the central area towards the edge area of the second memory cell array area 110a,' the shift values of the silicon substrate for the locations in the X direction may decrease. Accordingly, a transistor corresponding to location N−2 in the X direction may be shifted closer to the second memory cell array area 110a' than a transistor corresponding to location N in the X direction.

According to embodiments, a calculation equation for calculating the shift values of the patterns on the peripheral circuit area may be established based on the graph of FIG. 8. In detail, a calculation equation for calculating the shift values of the patterns may be established based on the distances between the patterns and the memory cell array area of the corresponding semiconductor chip and the distance between the memory cell array areas of the adjacent semiconductor chips, and also based on the locations of the patterns in the X direction.

In an embodiment, the peripheral circuit area PA may be divided into multiple regions along the X direction. Then, the shift values of the patterns may be calculated by using different calculation equations for different regions. In an embodiment, the peripheral circuit area PA may be divided into two regions with respect to a reference line in the X direction. For example, the shift direction of the patterns arranged on the left side of the reference line of the peripheral circuit area PA may be determined as a positive direction. The shift direction of the patterns arranged on the right side of the reference line may be determined as a negative direction.

Figure 9:
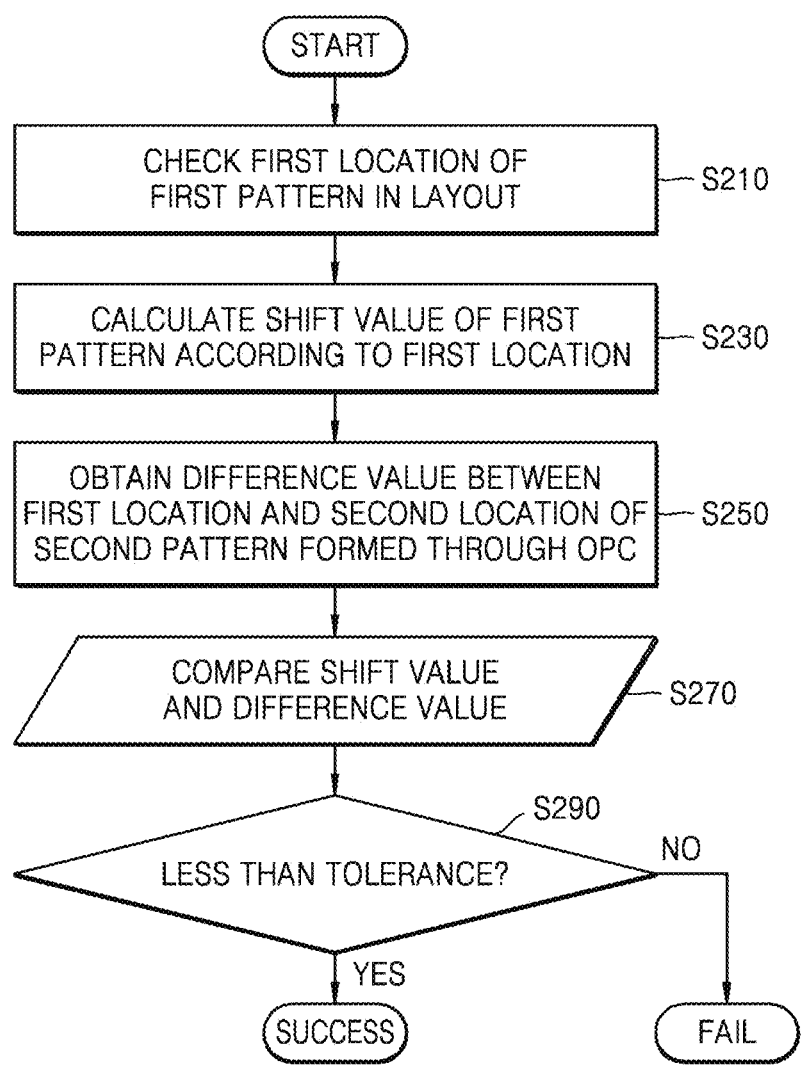
FIG. 9 is a flowchart of an optical proximity correction (OPC) verifying method for a stacked memory device according to an embodiment.

FIG. 9 is a flowchart of an OPC verifying method for a stacked memory device according to an embodiment.

Referring to FIG. 9, the OPC verifying method according to the present embodiment may correspond, for example, to an embodiment of operation S130 of FIG. 1. Accordingly, the contents described with reference to FIGS. 1 to 8 may be applied to the present embodiment, and a repeated description thereof will be omitted.

In operation S210, a first location of a first pattern in a layout of a stacked memory device is checked. Here, the stacked memory device may include a memory cell array area and a peripheral circuit area that is adjacent to the memory cell array area in a first direction. In an embodiment, the first pattern may include a contact pattern arranged in a peripheral circuit area. For example, the first pattern may include a gate contact pattern, a source contact pattern, or a drain contact pattern for a transistor arranged in the peripheral circuit area.

In an embodiment, the first location may be a Y coordinate along the first direction in a layout. In an embodiment, the first location may be an X coordinate along a second direction in a layout. In an embodiment, the first location may be a Y coordinate along the first direction and an X coordinate along the second direction in the layout. Hereinafter, the case in which the first location is a Y coordinate will be mainly described. Operation S210 will be described in more detail with reference to FIG. 10.

In operation S230, a shift value of a first pattern is calculated according to the first location. In detail, a shift value of the first pattern may be calculated such that at least one of a shift direction and the size of a shift value (that is, a shift amount) of the first pattern varies according to the first location. That is, the shift value of the first pattern may be represented by a vector. In an embodiment, the shift value of the first pattern may be calculated such that the shift direction and the shift amount of the first pattern vary according to the Y coordinate of the first pattern.

Here, the shift value of the first pattern may be a predicted shift value for the first pattern. In the present embodiment, the predicted shift value for the first pattern may be calculated by using a calculation equation established based on experience such as from previous calculations and determinations. For example, the calculation equation may be established based on the graphs of FIGS. 7 and 8.

In an embodiment, the calculation equation may be a linear function (that is, $f(x)=ax+b$). In an embodiment, the calculation equation may be a quadratic function (that is, $f(x)=ax^2+bx+c$). In an embodiment, the calculation equation may be a cubic function (that is, $f(x)=ax^3+bx^2+cx+d$). Then, a value input to x in the calculation equation may be the first location of the first pattern checked in operation S210, and for example, may be a Y coordinate of the first pattern. Meanwhile, in an embodiment, the calculation equation may be simply a constant value, and in this case, the shift value of the first pattern may be constant irrespective of the first location.

In some embodiments, the shift value of the first pattern may be calculated by applying the same calculation equation irrespective of the first location. In an embodiment, the first location of the first pattern checked in operation S210 may be a Y coordinate, and the shift value of the first pattern may be calculated by applying the same calculation equation irrespective of the Y coordinate in operation S230. In an embodiment, the first location of the first pattern checked in operation S210 may be an X coordinate, and the shift value of the first pattern may be calculated by applying the same calculation equation irrespective of the X coordinate in operation S230.

In some embodiments, the shift value of the first pattern may be calculated by applying different calculation equations according to the first location. In an embodiment, the first location of the first pattern checked in operation S210 may be a Y coordinate, and the shift value of the first pattern may be calculated by applying different calculation equations according to the Y coordinate in operation S230. For example, the shift value of the first pattern may be calculated by applying a linear function to some Y coordinates, and the shift value of the first pattern may be calculated by applying a cubic function to other Y coordinates. In an embodiment, the first location of the first pattern checked in operation S210 may be an X coordinate, and the shift value of the first pattern may be calculated by applying different calculation equations according to the X coordinate in operation S230. For example, the shift value of the first pattern may be calculated by applying a linear function to some X coordinates, and the shift value of the first pattern may be calculated by applying a cubic function to other X coordinates. Operation S230 will be described in more detail with reference to FIGS. 11 to 13.

In operation S250, a difference value between a second location of a second pattern, which is formed through OPC with respect to the first pattern, and the first location of the first pattern is obtained. In an embodiment, a difference value between a first Y coordinate corresponding to the first location and a second Y coordinate corresponding to the second location may be obtained. Operation S250 will be described in more detail with reference to FIGS. 14A to 14D.

In operation S270, the shift value and the difference value are compared. In operation S290, it is determined whether the comparison value is within a tolerance. It may be determined whether the second pattern is within a tolerance, based on the directions and sizes of the shift value and the difference value. If the second pattern is within the tolerance after the determination, it is determined that a misalignment of a contact corresponding to the first pattern is accurately corrected and it is determined that the OPC verification result is a success. If the second pattern deviates from the tolerance, it is determined that the misalignment of the contact corresponding to the first pattern is not accurately corrected and it is determined that the OPC verification result reflects a failure. In an embodiment, it may be determined that a secondary OPC is to be performed with respect to the second pattern. In an embodiment, it may be determined that a layout is formed again.

Figure 10:
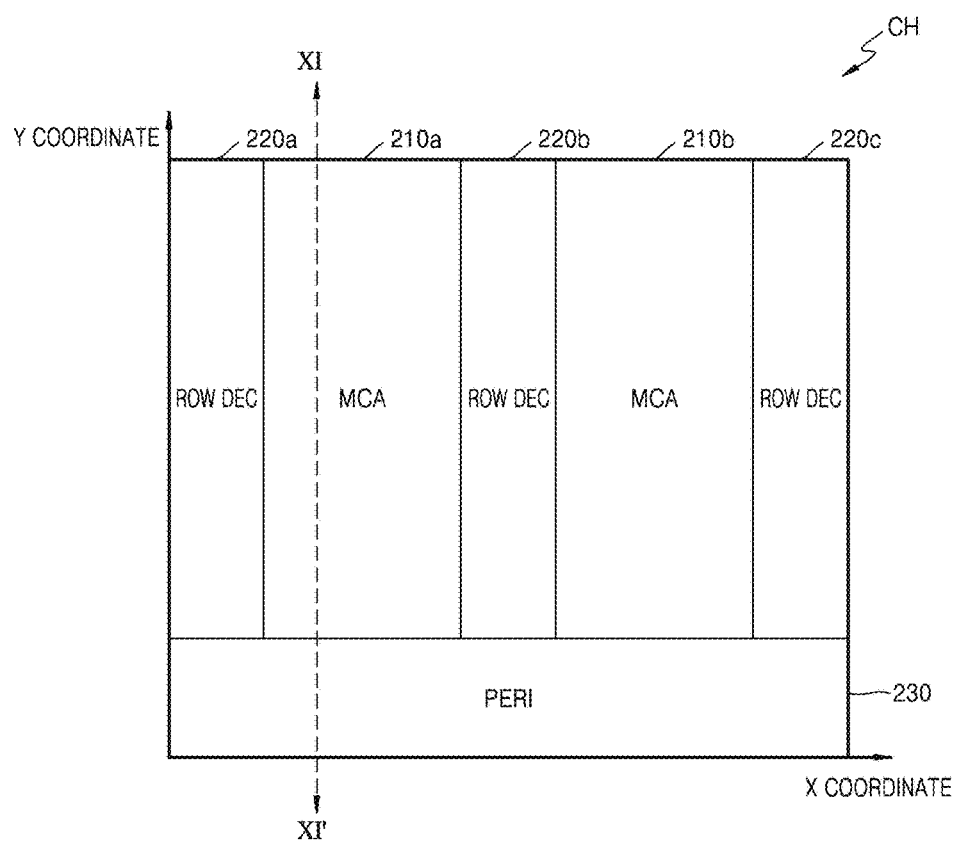
FIG. 10 is a view illustrating an operation of checking a location of a pattern in a layout of a stacked memory device according to an embodiment.

FIG. 10 is a view illustrating an operation of checking a location of a pattern in a layout of a stacked memory device according to an embodiment.

Referring to FIG. 10, the stacked memory device may be implemented in a semiconductor chip CH. The semiconductor chip CH may include memory cell array areas 210a and 210b, row decoder areas 220a to 220c, and a peripheral circuit area 230. The row decoder areas 220a to 220c may be adjacent to the memory cell array areas 210a and 210b in the X direction. Row decoders may be arranged in the row decoder areas 220a to 220c. The peripheral circuit area 230 may be adjacent to the memory cell array areas 210a and 210b and the row decoder areas 220a to 220c in the Y direction. A page buffer, a data input/output circuit, and the like may be arranged in the peripheral circuit area 230.

In an embodiment, the Y coordinates of the patterns arranged in the peripheral circuit area 230 may be checked. In an embodiment, the X coordinates of the patterns arranged in the peripheral circuit area 230 may be checked. In an embodiment, the X coordinates and the Y coordinates of the patterns arranged in the peripheral circuit area 230 may be checked.

Further, in an embodiment, the Y coordinates of the patterns arranged in the row decoder areas 220a to 220c may be checked. Further, in an embodiment, the X coordinates of the patterns arranged in the row decoder areas 220a to 220c may be checked. Further, in an embodiment, the X coordinates and the Y coordinates of the patterns arranged in the row decoder areas 220a to 220c may be checked.

Figure 11:
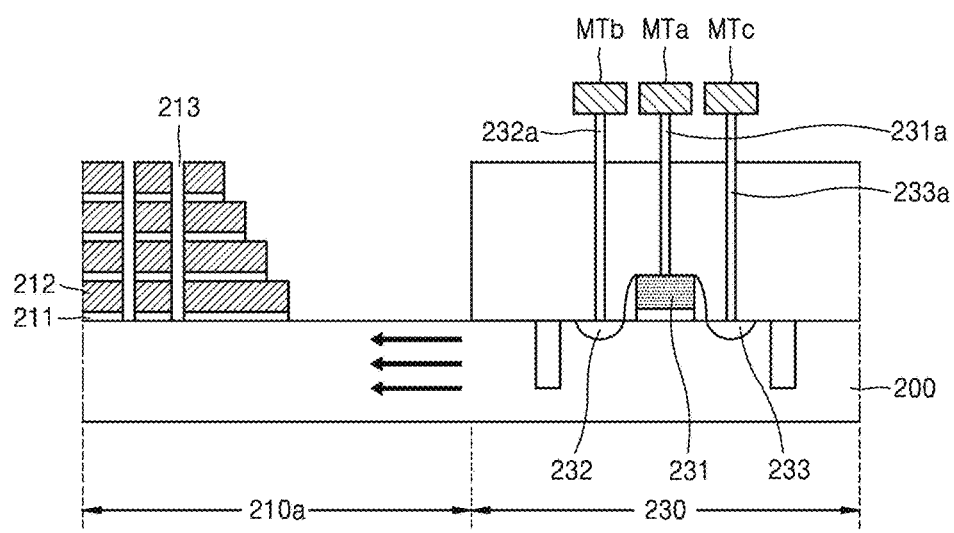
FIG. 11 is a sectional view taken along a line XI-XI' of FIG. 10.

FIG. 11 is a sectional view taken along a line XI-XI' of FIG. 10.

Referring to FIG. 11, the substrate 200 may be divided into a memory cell array area 210a and a peripheral circuit area 230. A memory cell array that includes channel holes 213 and a stack structure of interlayer insulting films 211 and gate electrodes 212 may be formed in the memory cell array area 210a. A transistor TR that includes a gate electrode 231, a source area 232, and a drain area 233 may be formed in the peripheral circuit area 230. A gate contact 231a, a source contact 232a, and a drain contact 233a may be respectively formed on the gate electrode 231, the source area 232, and the drain area 233. Metallic layers MTa, mm, and MTc may be respectively formed on the gate contact 231a, the source contact 232a, and the drain contact 233a. As described above, the transistor TR may be shifted towards the memory cell array area 210a due to the stress during a cell array forming process.

Figure 12:
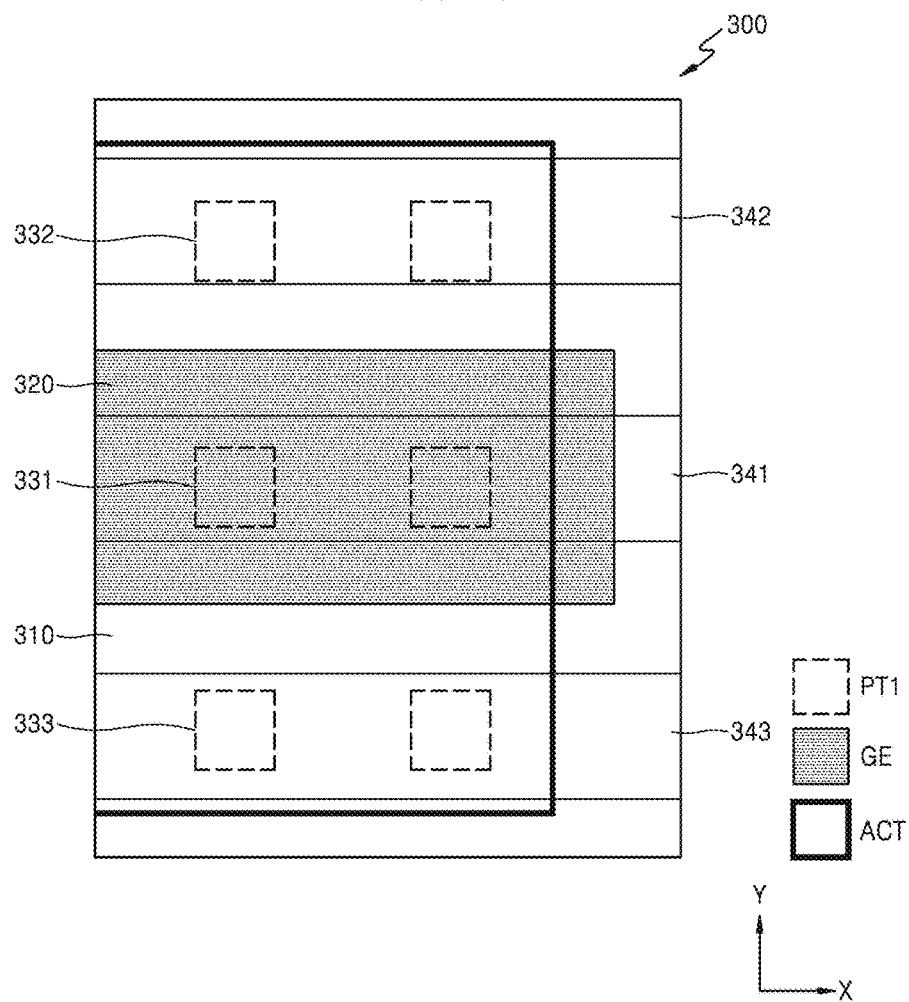
FIG. 12 is an initial layout for the peripheral circuit area of FIG. 11.

FIG. 12 is an initial layout 300 for the peripheral circuit area 230 of FIG. 11.

Referring to FIG. 12, the initial layout 300 for the peripheral circuit area 230 may be a layout designed, for example, in operation S110 of FIG. 1. The initial layout 300 includes an active area pattern 310, a gate electrode pattern 320, a gate contact pattern 331, a source contact pattern 332, a drain contact pattern 333, and metallic layer patterns 341 to 343.

The active area pattern 310 may correspond to an active area of the peripheral circuit area 230 of FIG. 11. The gate electrode pattern 320 may correspond to the gate electrode 231 of FIG. 11. Further, the gate contact pattern 331, the source contact pattern 332, and the drain contact patter 333 may correspond to the gate contact 231a, the source contact 232a, and the drain contact 233a of FIG. 11, respectively. Further, the metallic layer patterns 341 to 343 may respectively correspond to the metallic layers MTa to MTc of FIG. 11.

The initial layout 300 may not properly reflect the shift of the silicon substrate corresponding to the peripheral circuit area 230 due to the stress during the cell array forming process. Accordingly, according to the present embodiment, in operation S210 of FIG. 9, the locations of the gate contact pattern 331, the source contact pattern 332, and the drain contact pattern 333 in the initial layout 300 may be checked. In an embodiment, the Y coordinates of the gate contact pattern 331, the source contact pattern 332, and the drain contact pattern 333 may be checked. Hereinafter, the gate contact pattern 331, the source contact pattern 332, and the drain contact pattern 333 may be referred to as first patterns PT1.

Figure 13:
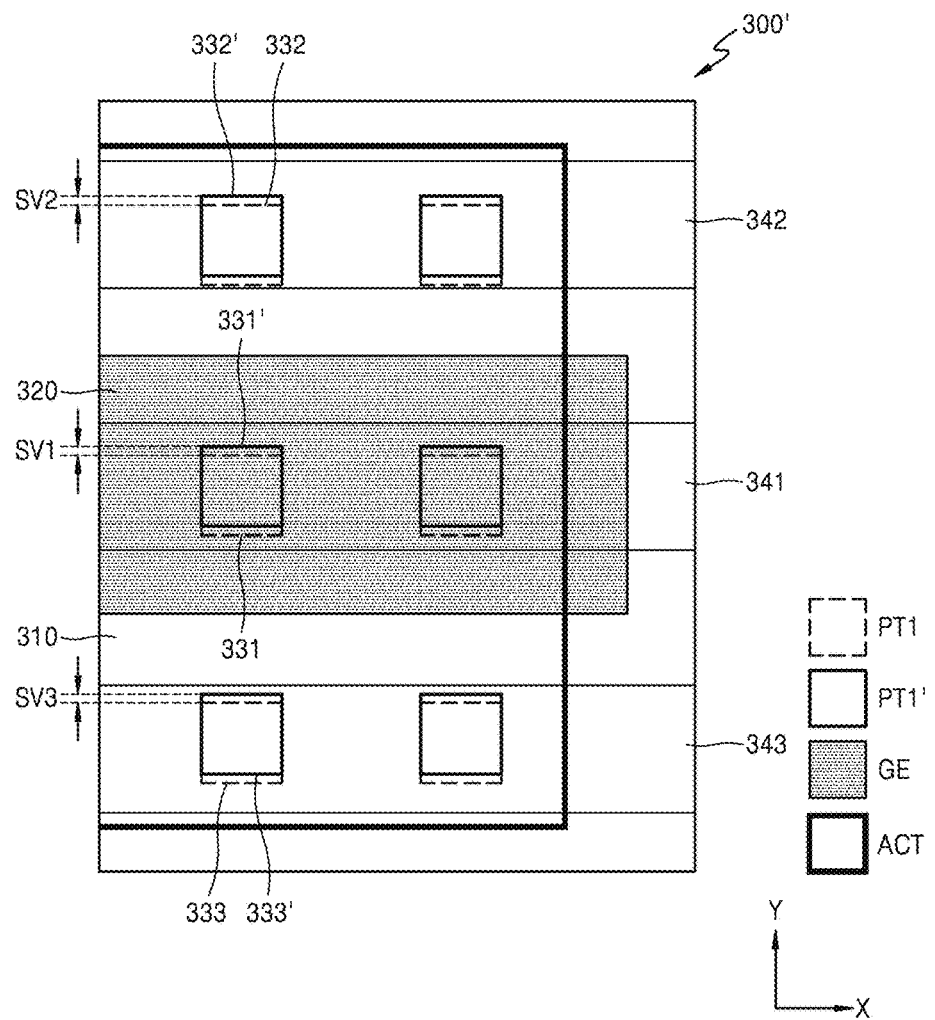
FIG. 13 illustrates first correction patterns for the first patterns of FIG. 12, according to a pattern shift value calculating operation of an embodiment.

FIG. 13 illustrates first correction patterns PT1' for the first patterns PT1 of FIG. 12, according to a pattern shift value calculating operation of an embodiment.

Referring to FIG. 13, the shift values SV1, SV2, and SV3 may be calculated according to the locations of the gate contact pattern 331, the source contact pattern 332, and the drain contact pattern 333 corresponding to the first patterns PT1. As compared with the layout 300 of FIG. 12, the layout 300' of FIG. 13 further includes a corrected gate contact pattern 331', a corrected source contact pattern 332', and a corrected drain contact pattern 333'. The corrected gate contact pattern 331', the corrected source contact pattern 332', and the corrected drain contact pattern 333' may be formed based on shift values SV1, SV2, and SV3 respectively calculated for the gate contact pattern 331, the source contact pattern 332, and the drain contact pattern 333. Hereinafter, the corrected gate contact pattern 331', the corrected source contact pattern 332', and the corrected drain contact pattern 333' may be referred to as first corrected patterns PT1'.

In an embodiment, the locations of the gate contact pattern 331, the source contact pattern 332, and the drain contact pattern 333 may be classified by their Y coordinates. For example, the source contact pattern 332 is closest to the memory cell array area 210a, and the drain contact pattern 333 may be farthest from the memory cell array area 210a. Accordingly, the shift values SV1, SV2, and SV3 of the gate contact pattern 331, the source contact pattern 332, and the drain contact pattern 333 may be different from each other.

In an embodiment, the shift values according to the Y coordinates may be calculated by applying the same calculation equation to the gate contact pattern 331, the source contact pattern 332, and the drain contact pattern 333. For example, the calculation equation may be implemented by a cubic function and the Y coordinates of the gate contact pattern 331, the source contact pattern 332, and the drain contact pattern 333 are different from each other. As a result, the shift values SV1, SV2, and SV3 for the gate contact pattern 331, the source contact pattern 332, and the drain contact pattern 333 may be calculated differently. The cubic function may be established in advance from experience with previous calculations and functions.

In an embodiment, the shift values according to the Y coordinates may be calculated by applying different calculation equations to the gate contact pattern 331, the source contact pattern 332, and the drain contact pattern 333. For example, a calculation equation implemented by a linear function may be applied to the gate contact pattern 331 and the source contact pattern 332. A calculation implemented by a cubic function may be applied to the drain contact pattern 333. The linear function and the cubic function may be established in advance from experience with previous calculations and functions.

FIGS. 14A to 14D illustrate various embodiments of the first pattern PT1 of FIG. 11 and a second pattern PT2 formed through OPC for the first pattern PT1. In FIGS. 14A to 14D, the first pattern PT1 may be one of the gate contact pattern 331, the source contact pattern 332, and the drain contact pattern 333 of FIG. 11. Hereinafter, the case in which the first pattern PT1 corresponds to the gate contact pattern 331 of FIG. 11 will be mainly described.

Figure 14A:
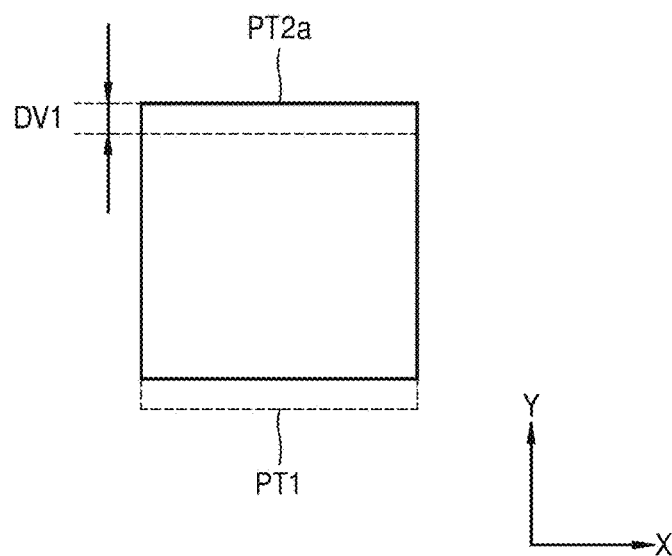
FIGS. 14A to 14D illustrate various embodiments of the first pattern of FIG. 12 and a second pattern formed through OPC with respect to the first pattern.

Referring to FIG. 14A, the second pattern PT2a may be a pattern formed by performing an OPC with respect to the first pattern PT1. The location of the second pattern PT2a along the Y direction may be shifted in a positive direction by a first difference value DV1 as compared with the location of the first pattern PT1 in the Y direction.

According to the present embodiment, the first difference value DV1 may be obtained by a difference value between the first location of the first pattern PT1 and the second location of the second pattern PT2. Subsequently, it is determined whether or not the first difference value DV1 is within an OPC tolerance by comparing the first difference value DV1 with the shift value SV1. In FIG. 14A, the directions of the first difference value DV1 and the shift value SV1 may be the same. The difference between the first difference value DV1 and the shift value SV1 may be within a reference value. Then, a contact may be formed by manufacturing a mask according to the second pattern PT2a, assuming that the OPC is successful. A misalignment of the contact may thus be prevented.

Figure 14B:
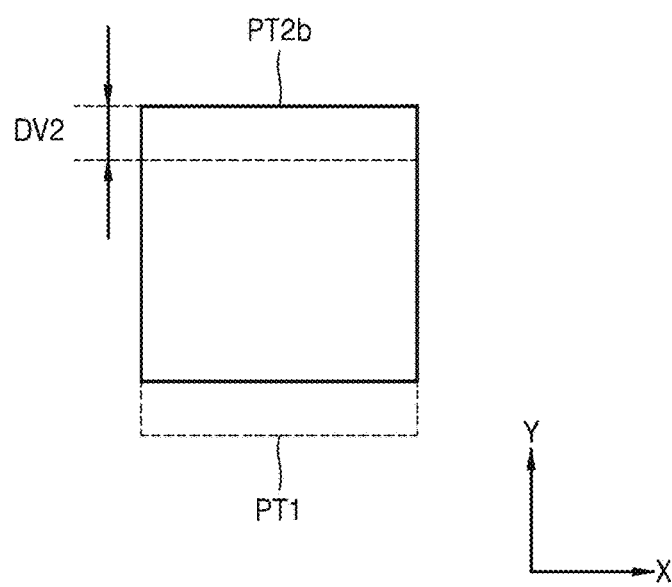

Referring to FIG. 14B, the second pattern PT2b may be a pattern formed by performing an OPC with respect to the first pattern PT1. The location of the second pattern PT2b along the Y direction may be shifted in a positive direction by a second difference value DV2 as compared with the location of the first pattern PT1 in the Y direction. Then, the second difference value DV2 may be larger than the first difference value DV1 of FIG. 14A.

According to the present embodiment, the second difference value DV2 may be obtained by a difference value between the first location of the first pattern PT1 and the second location of the second pattern PT2. Subsequently, it is determined whether or not the second difference value DV2 is within an OPC tolerance by comparing the second difference value DV2 with the shift value SV1. In FIG. 14B, the directions of the second difference value DV2 and the shift value SV1 may be the same, but the difference between the second difference value DV2 and the shift value SV1 may be larger than a reference value. Then, it may be determined that a secondary OPC is to be performed, assuming that the OPC failed.

Figure 14C:
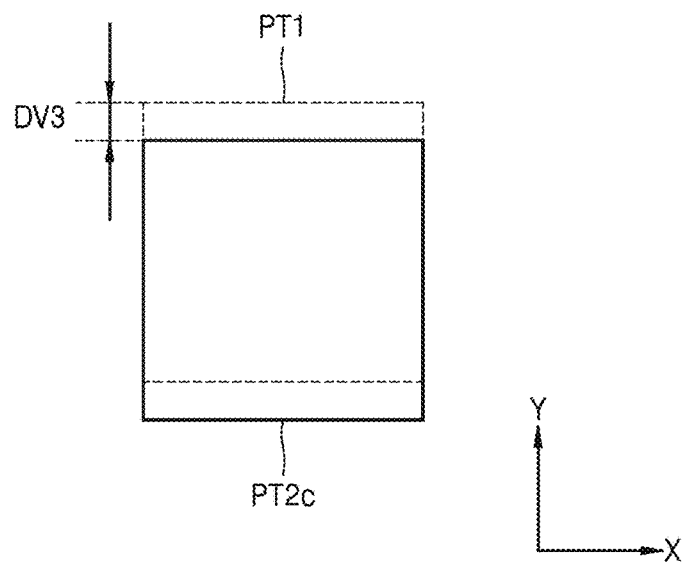

Referring to FIG. 14C, the second pattern PT2c may be a pattern formed by performing an OPC with respect to the first pattern PT1. The location of the second pattern PT2c along the Y direction may be shifted in a negative direction by a third difference value DV3 as compared with the location of the first pattern PT1 in the Y direction.

According to the present embodiment, the third difference value DV3 may be obtained by a difference value between the first location of the first pattern PT1 and the second location of the second pattern PT2c. Subsequently, it is determined whether or not the third difference value DV3 is within an OPC tolerance by comparing the third difference value DV3 with the shift value SV1. In FIG. 14C, the difference between the third difference value DV3 and the shift value SV1 is less than a reference value, but the directions of the third difference value DV3 and the shift value SV1 may be different. Then, it may be determined that a secondary OPC is to be performed, assuming that the OPC failed.

Figure 14D:
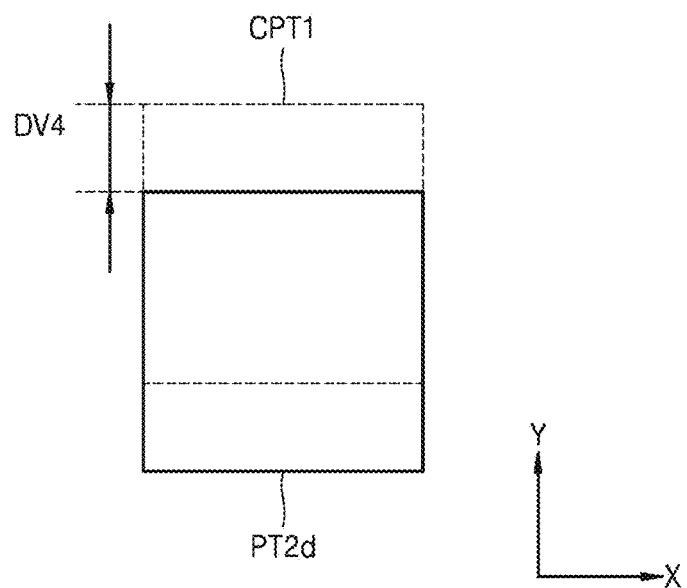

Referring to FIG. 14D, the second pattern PT2d may be a pattern formed by performing an OPC with respect to the first pattern PT1. The location of the second pattern PT2d along the Y direction may be shifted in a negative direction by a fourth difference value DV4 compared with the location of the first pattern PT1 in the Y direction.

According to the present embodiment, the fourth difference value DV4 may be obtained by a difference value between the first location of the first pattern PT1 and the second location of the second pattern PT2d. Subsequently, it is determined whether or not the fourth difference value DV4 is within an OPC tolerance by comparing the fourth difference value DV4 with the shift value SV1. In FIG. 14D, the difference between the fourth difference value DV4 and the shift value SV1 is larger than a reference value, but the directions of the fourth difference value DV4 and the shift value SV1 may be different. Then, it may be determined that a secondary OPC is to be performed assuming that the OPC failed.

FIG. 15A to 17B illustrates pattern shift value calculation methods for the peripheral circuit area according to some embodiments.

Figure 15A:
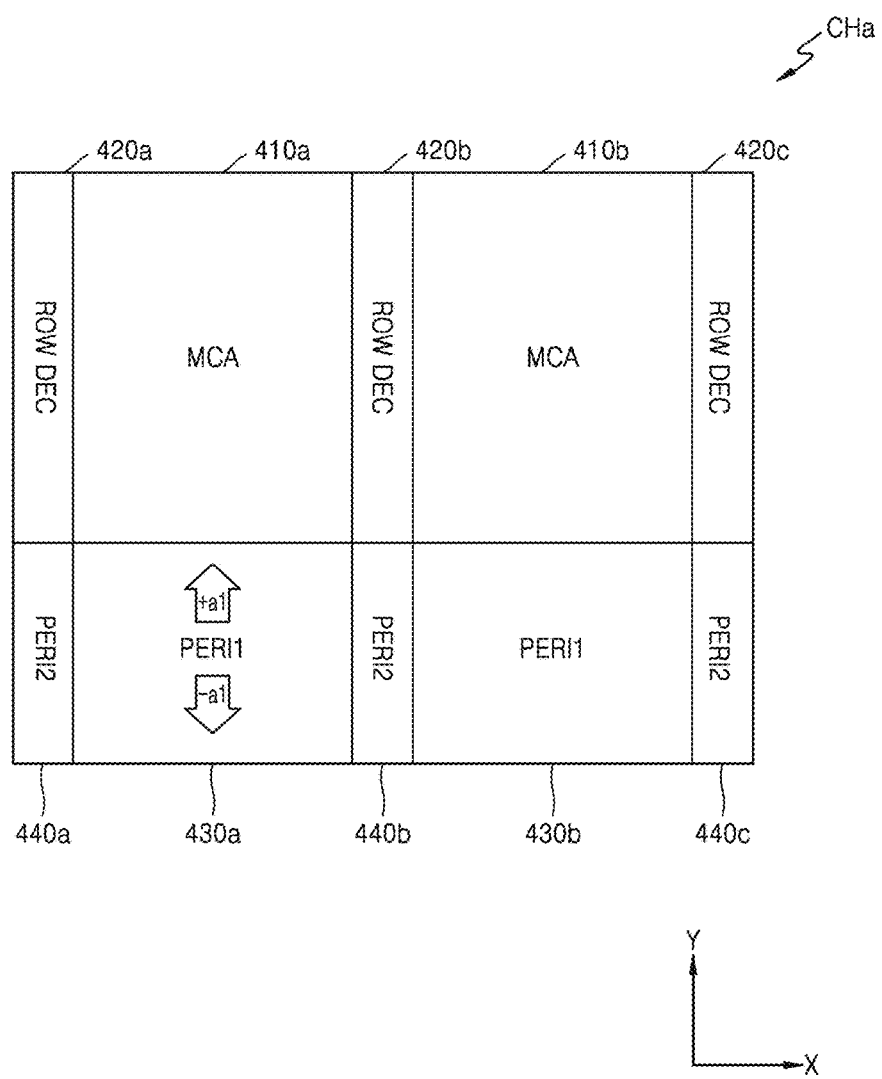
FIG. 15A to 17B illustrates pattern shift value calculation methods for the peripheral circuit area according to some embodiments.

Referring to FIG. 15A, the stacked memory device may be implemented in a semiconductor chip Cha. The semiconductor chip CHa may include memory cell array areas 410a and 410b, row decoder areas 420a to 420c, first peripheral circuit areas 430a and 430b, and second peripheral circuit areas 440a to 440c. The row decoder areas 420a to 420c may be adjacent to the memory cell array areas 410a and 410b in the X direction. Row decoders may be arranged in the row decoder areas 420a to 420c.

The first peripheral circuit areas 430a and 430b may be adjacent to the memory cell array areas 410a and 410b in the Y direction. For example, a page buffer, a data input/output circuit, and the like may be arranged in the first peripheral circuit areas 430a and 430b. The second peripheral circuit areas 440a to 440c may be adjacent to the first peripheral circuit areas 430a and 430b in the X direction, and may be adjacent to the row decoder areas 420a to 420c in the Y direction. For example, a discharge circuit connected to the common source line CSL and the like may be arranged in the second peripheral circuit areas 440a to 440c.

In the present embodiment, the shift values for the first patterns arranged in the first peripheral circuit areas 430a and 430b and the second peripheral circuit areas 440a to 440c may be calculated. The shift values for such first patterns may be calculated by applying the same calculation equations to the first peripheral circuit areas 430a and 430b and the second peripheral circuit areas 440a to 440c. That is, the calculation equations applied to calculate shift values may be determined, irrespective of the X coordinates.

For example, while taking a reference line corresponding to a Y coordinate of 0 as the center, the shift values for the first patterns arranged above the reference line in the first peripheral circuit areas 430a and 430b and the second peripheral circuit areas 440a to 440c may be determined by +a1. The shift values for the first patterns arranged below the reference line in the first peripheral circuit areas 430a and 430b and the second peripheral circuit areas 440a to 440c may be determined by −a1.

For example, while taking a reference line corresponding to a Y coordinate of 0 as the center, the shift values for the first patterns arranged above the reference line in the first peripheral circuit areas 430a and 430b and the second peripheral circuit areas 440a to 440c may be determined by applying a first calculation equation. The shift values for the first patterns arranged below the reference line in the first peripheral circuit areas 430a and 430b and the second peripheral circuit areas 440a to 440c may be determined by applying a second calculation equation.

Figure 15B:
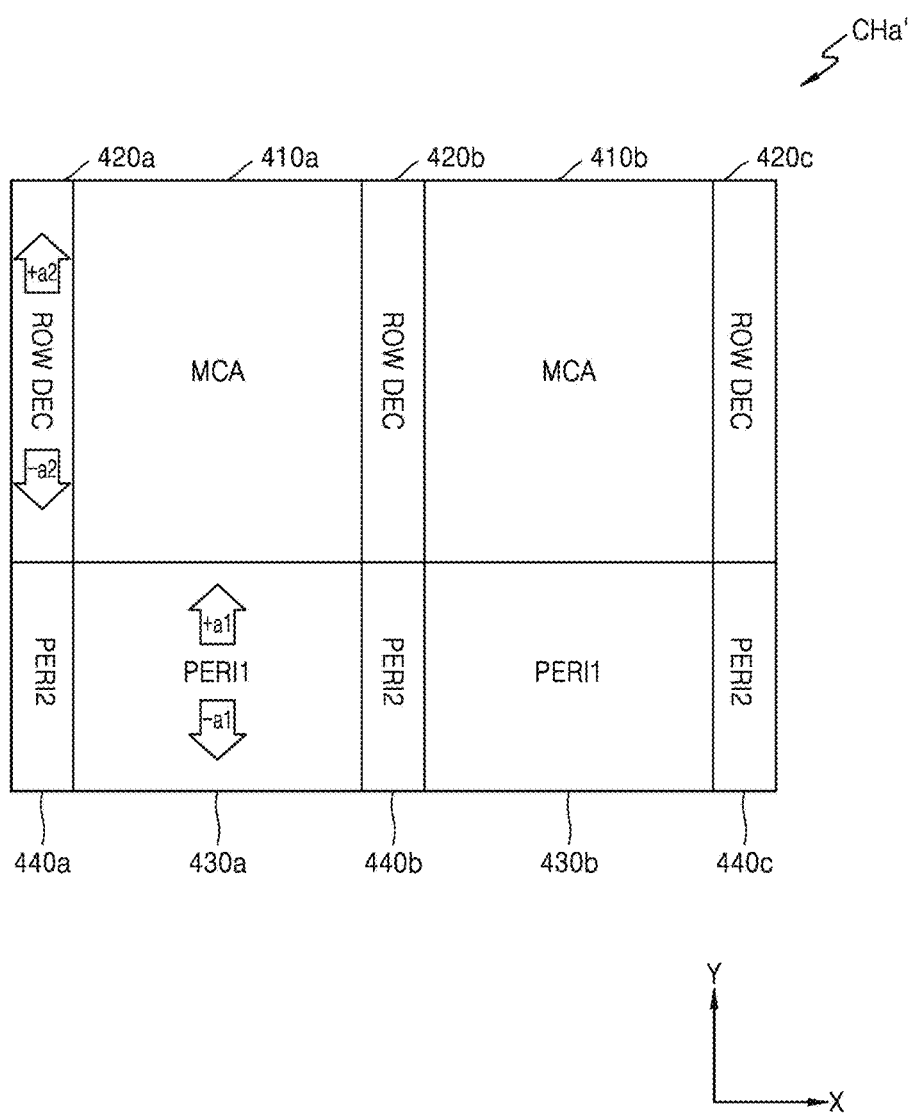

Referring to FIG. 15B, the stacked memory device may be implemented in a semiconductor chip CHa'. The semiconductor chip CHb' according to the present embodiment is a modified embodiment of the semiconductor chip CHa of FIG. 15a, and only the difference therebetween will be mainly described below.

In the present embodiment, the shift values for the first patterns arranged in the row decoder areas 420a to 420c may be calculated by applying the first calculation equation to the row decoder areas 420a to 420c. That is, the calculation equations applied to calculate shift values may be determined based on the Y coordinates, irrespective of the X coordinates. For example, while taking the first reference line according to the Y coordinates as the center, the shift values for the first patterns arranged above the first reference line in the row decoder areas 420a to 420c may be determined by +a2. The shift values for the first patterns arranged below the first reference line in the row decoder areas 420a to 420c may be determined by −a2. For example, the first calculation equation may be implemented by a linear function.

In the present embodiment, the shift values for the first patterns arranged in the first peripheral circuit areas 430a and 430b and the second peripheral circuit areas 440a to 440c may be calculated. The shift values for such first patterns may be calculated by applying a second calculation equation different from the first calculation equation applied to the row decoder areas 420a to 420c, to the first peripheral circuit areas 430a and 430b and the second peripheral circuit areas 440a to 440c. That is, the calculation equations applied to calculate shift values may be determined based on the Y coordinates, irrespective of the X coordinates.

In the present embodiment, the shift values for the first patterns arranged in the first peripheral circuit areas 430a and 430b and the second peripheral circuit areas 440a to 440c may be calculated. The shift values for such first patterns may be calculated by applying the first calculation equation applied to the row decoder areas 420a to 420c, to the first peripheral circuit areas 430a and 430b and the second peripheral circuit areas 440a to 440c. Further, in an embodiment, the shift values for the first patterns arranged in the row decoder areas 420a to 420c may be calculated by applying the first calculation equation to the row decoder areas 420a to 420c. A shift value is not necessarily separately calculated for the first patterns arranged in the first peripheral circuit areas 430a and 430b and the second peripheral circuit areas 440a to 440c.

Figure 16A:
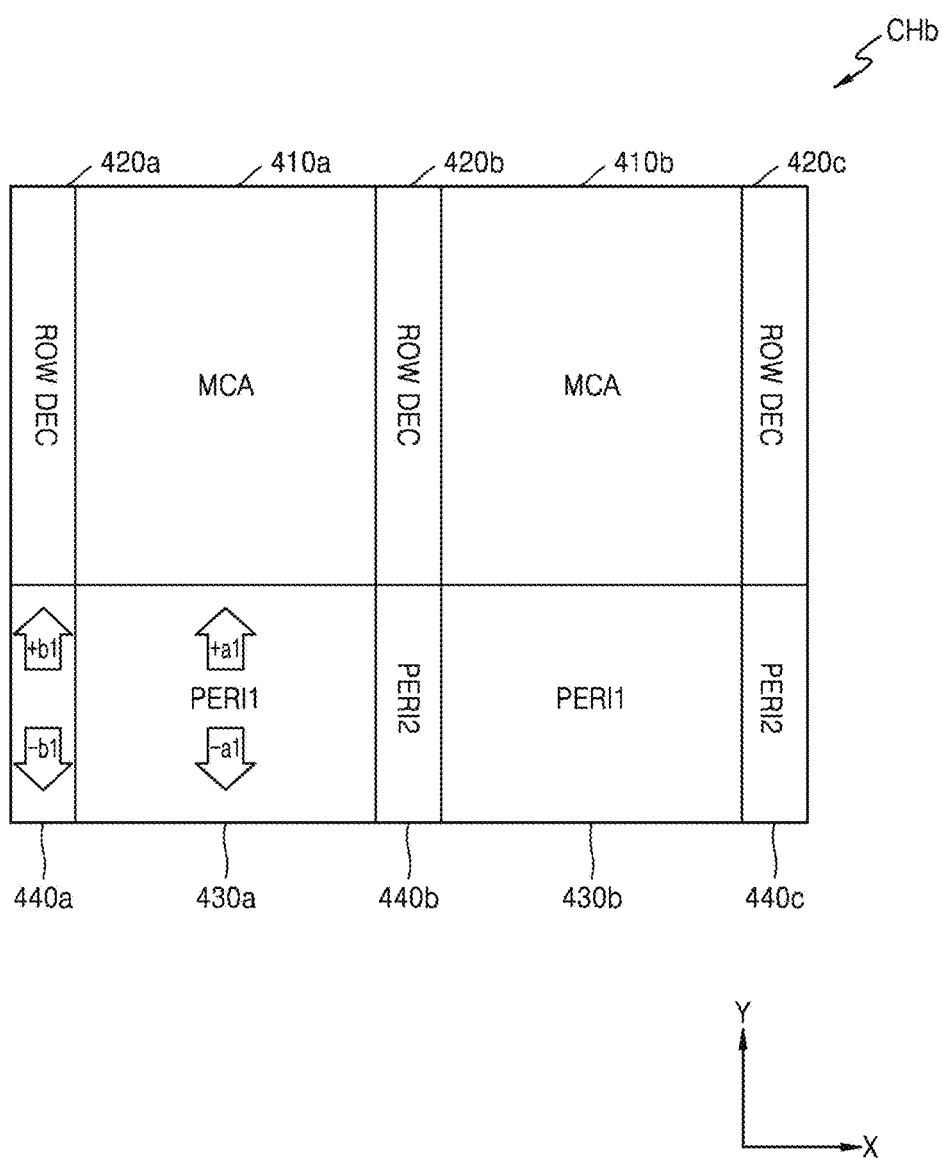

Referring to FIG. 16A, the stacked memory device may be implemented in a semiconductor chip CHb. The semiconductor chip CHb according to the present embodiment is a modified embodiment of the semiconductor chip CHa of FIG. 15a, and only the difference therebetween will be mainly described below. In an embodiment, the second peripheral circuit areas 440a to 440c may be divided into multiple regions according to their X coordinates, respectively.

In the present embodiment, the shift values for the first patterns arranged in the first peripheral circuit areas 430a and 430b and the second peripheral circuit areas 440a to 440c may be calculated, by applying the different calculation equations to the first peripheral circuit areas 430a and 430b and the second peripheral circuit areas 440a to 440c. That is, the calculation equations applied to calculate shift values may be determined based on the Y coordinates, based on the X coordinates and the Y coordinates.

For example, while taking the reference line corresponding to the Y coordinate of 0 as the center, the shift values for the first patterns arranged above the reference line in the first peripheral circuit areas 430a and 430b may be determined by +a1. The shift values for the first patterns arranged below the reference line in the first peripheral circuit areas 430a to 420c may be determined by −a1. Further, the shift values for the first patterns arranged above the reference line in the second peripheral circuit areas 440a to 440c may be determined by +b1. The shift values for the first patterns arranged below the reference line in the second peripheral circuit areas 440a to 440c may be determined by −b1.

For example, while taking the reference line corresponding to the Y coordinate of 0 as the center, the shift values for the first patterns arranged above the reference line in the first peripheral circuit areas 430a and 430b may be determined by applying the first calculation equation. The shift values for the first patterns arranged below the reference line in the first peripheral circuit areas 430a to 420c may be determined by applying the second calculation equation. Further, the shift values for the first patterns arranged above the reference line in the second peripheral circuit areas 440a to 440c may be determined by applying a third calculation equation. The shift values for the first patterns arranged below the reference line in the second peripheral circuit areas 440a to 440c may be determined by applying a fourth calculation equation.

Figure 16B:
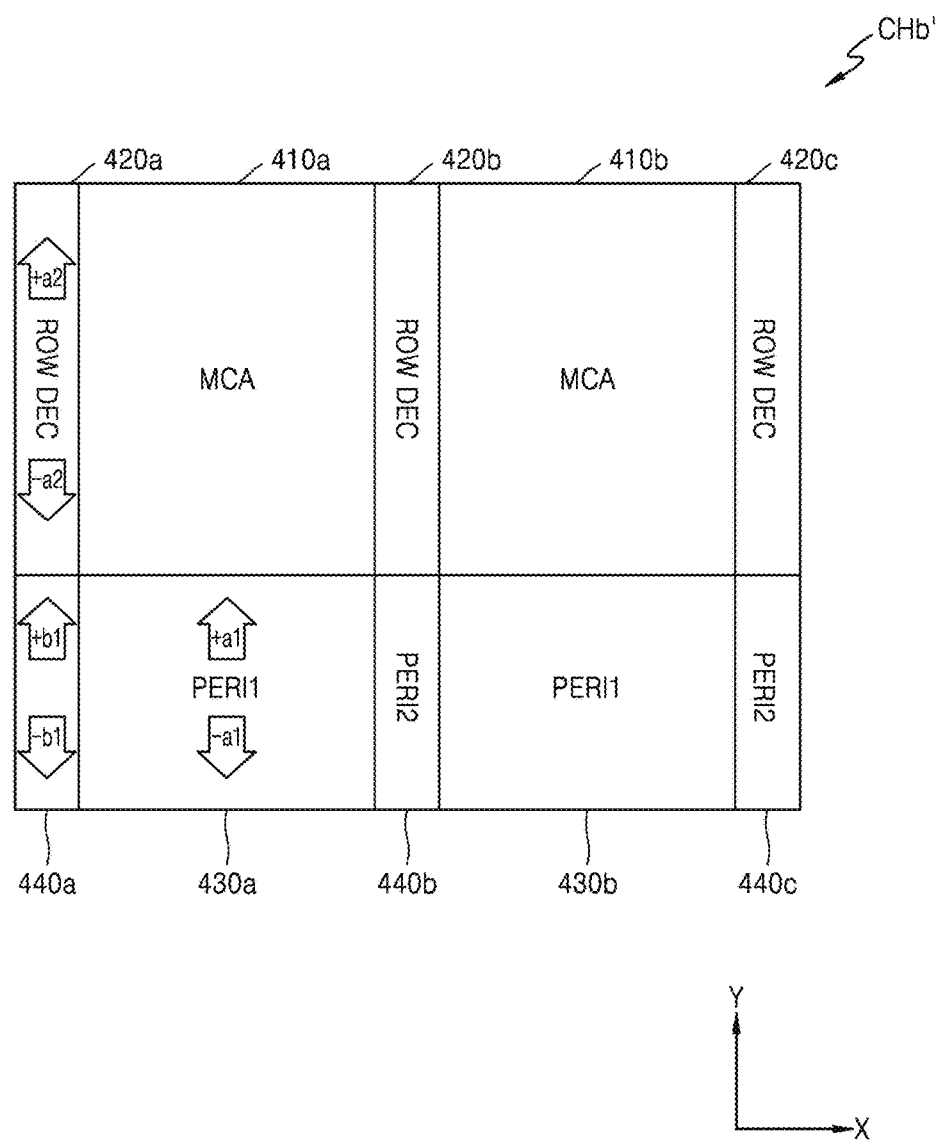

Referring to FIG. 16B, the stacked memory device may be implemented in a semiconductor chip CHb'. The semiconductor chip CHb' according to the present embodiment is a modified embodiment of the semiconductor chip CHb of FIG. 16A, and only the difference therebetween will be mainly described below.

In the present embodiment, the shift values for the first patterns arranged in the row decoder areas 420a to 420c may be calculated by applying the first calculation equation to the row decoder areas 420a to 420c. That is, the calculation equations applied to calculate shift values may be determined based on the Y coordinates, irrespective of the X coordinates. For example, while taking the first reference line according to the Y coordinates as the center, the shift values for the first patterns arranged above the first reference line in the row decoder areas 420a to 420c may be determined by +a2. The shift values for the first patterns arranged below the first reference line in the row decoder areas 420a to 420c may be determined by −a2. For example, the first calculation equation may be implemented by a linear function.

Figure 17A:
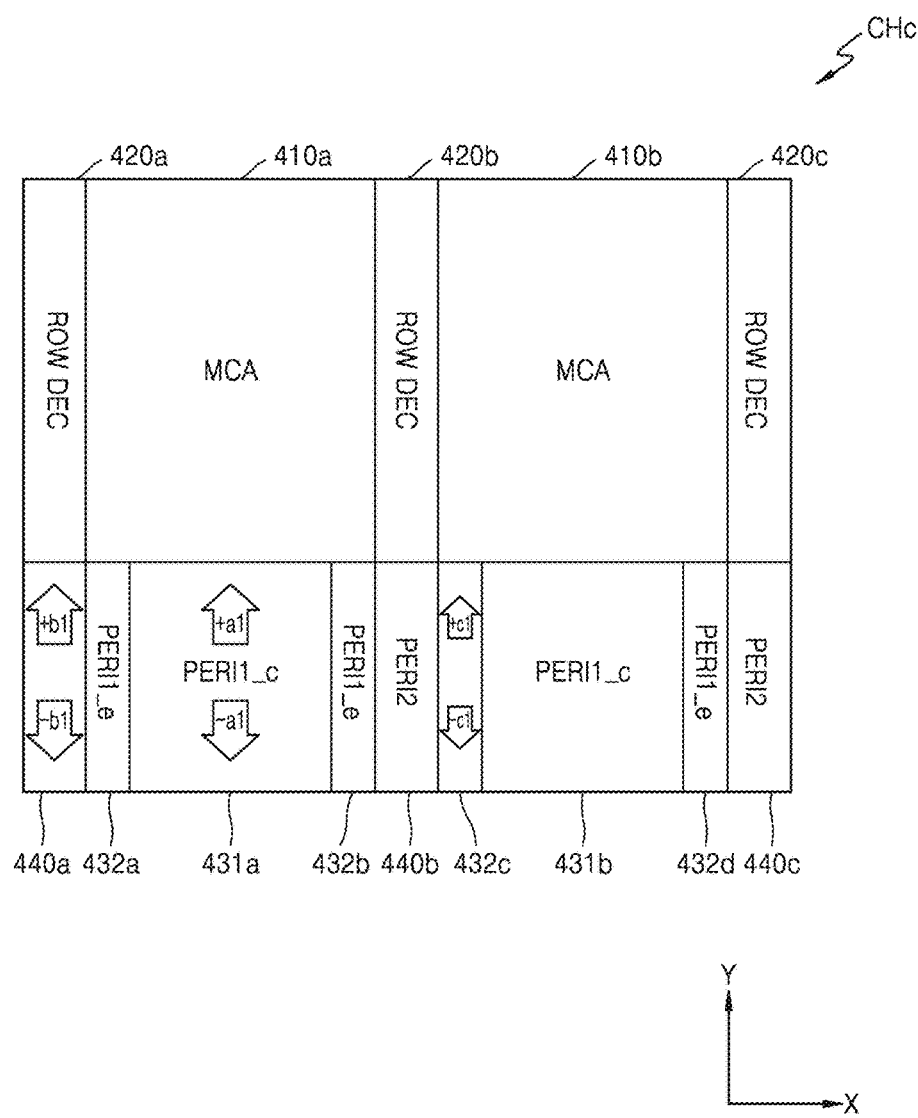

Referring to FIG. 17A, the stacked memory device may be implemented in a semiconductor chip CHc. The semiconductor chip CHc according to the present embodiment is a modified embodiment of the semiconductor chip CHa of FIG. 15a, and only the difference therebetween will be mainly described below.

In an embodiment, the first central peripheral circuit areas 431a and 431b may be divided into multiple regions according to their X coordinates, respectively. In an embodiment, the first edge peripheral circuit areas 432a to 432d may be divided into multiple regions according to their X coordinates, respectively. In an embodiment, the second peripheral circuit areas 440a to 440c may be divided into multiple regions according to their X coordinates, respectively.

Meanwhile, although the peripheral circuit area that is adjacent to the first memory cell array area 410a in the Y direction is divided into the first central peripheral circuit area 431a and the second edge peripheral circuit areas 432a and 432b in FIG. 17A, the peripheral circuit area is not limited thereto. In another embodiment, the peripheral circuit area that is adjacent to the first memory cell array area 410a in the Y direction may be divided into multiple regions according to their X coordinates. For example, the peripheral circuit area that is adjacent to the first memory cell array area 410a in the Y direction may be divided into a left peripheral circuit area and a right peripheral circuit area. Similarly, the peripheral circuit area that is adjacent to the second memory cell array area 410b in the Y direction may be divided into a left peripheral circuit area and a right peripheral circuit area.

The first central peripheral circuit area 431a may be adjacent to a central area of the memory cell array area 410a in the Y direction. Devices connected to the central area of the memory cell array area 410a through multiple central bit lines may be arranged in the first central peripheral circuit area 431a. The second central peripheral circuit area 431b may be adjacent to a central area of the memory cell array area 410b in the Y direction. Devices connected to the central area of the memory cell array area 410b through multiple central bit lines may be arranged in the second central peripheral circuit area 431b. Transistors arranged in the first and second central peripheral circuit areas 431*a* and 431*b* will be referred to as central transistors.

The first edge peripheral circuit area 432*a* and 432*b* may be adjacent to an edge area of the memory cell array area 410*a* in the Y direction. Devices connected to the edge area of the memory cell array area 410*a* through multiple edge bit lines may be arranged in the first edge peripheral circuit area 432*a* and 432*b*. The first edge peripheral circuit area 432*c* and 432*d* may be adjacent to an edge area of the memory cell array area 410*b* in the Y direction. Devices connected to the edge area of the memory cell array area 410*b* through multiple edge bit lines may be arranged in the first edge peripheral circuit area 432*c* and 432*d*. Transistors arranged in the first and second edge peripheral circuit areas 432*a* to 432*d* will be referred to as edge transistors.

In the present embodiment, shift values may be calculated for the first patterns arranged in the first central peripheral circuit areas 431*a* and 431*b*, the first edge peripheral circuit areas 432*a* to 432*d*, and the second peripheral circuit areas 440*a* to 440*c*. The shift values may be calculated by applying different calculation equations to the first central peripheral circuit areas 431*a* and 431*b*, the second edge peripheral circuit areas 432*a* to 432*d*, and the second peripheral circuit areas 440*a* to 440*c*. That is, the calculation equations applied to calculate shift values may be based on the X coordinates and the Y coordinates.

For example, while taking the reference line corresponding to the Y coordinate of 0 as the center, the shift values for the first patterns arranged above the reference line in the first central peripheral circuit areas 431*a* and 431*b* may be determined by +a1. The shift values for the first patterns arranged below the reference line in the first central peripheral circuit areas 431*a* and 431*b* may be determined by −a1. Further, the shift values for the first patterns arranged above the reference line in the first edge peripheral circuit areas 432*a* to 432*d* may be determined by +c1. The shift values for the first patterns arranged below the reference line in the first edge peripheral circuit areas 432*a* to 432*d* may be determined by −c1. Further, the shift values for the first patterns arranged above the reference line in the second peripheral circuit areas 440*a* to 440*c* may be determined by +b1. The shift values for the first patterns arranged below the reference line in the second peripheral circuit areas 440*a* to 440*c* may be determined by −b1.

For example, while taking the reference line corresponding to the Y coordinate of 0 as the center, the shift values for the first patterns arranged above the reference line in the first central peripheral circuit areas 431*a* and 431*b* may be determined by applying the first function. The shift values for the first patterns arranged below the reference line in the first central peripheral circuit areas 431*a* to 431*b* may be determined by applying the second function. Further, the shift values for the first patterns arranged above the reference line in the first edge peripheral circuit areas 432*a* to 432*d* may be determined by applying a third function. The shift values for the first patterns arranged below the reference line in the first edge peripheral circuit areas 432*a* to 432*d* may be determined by applying a fourth function. Further, the shift values for the first patterns arranged above the reference line in the second peripheral circuit areas 440*a* to 440*c* may be determined by applying a fifth function. The shift values for the first patterns arranged below the reference line in the second peripheral circuit areas 440*a* to 440*c* may be determined by applying a sixth function. In an embodiment, the first to sixth functions may be all different from each other. In an embodiment, at least two of the first to sixth functions may be the same. In an embodiment, all of the first to sixth functions may be the same.

Figure 17B:
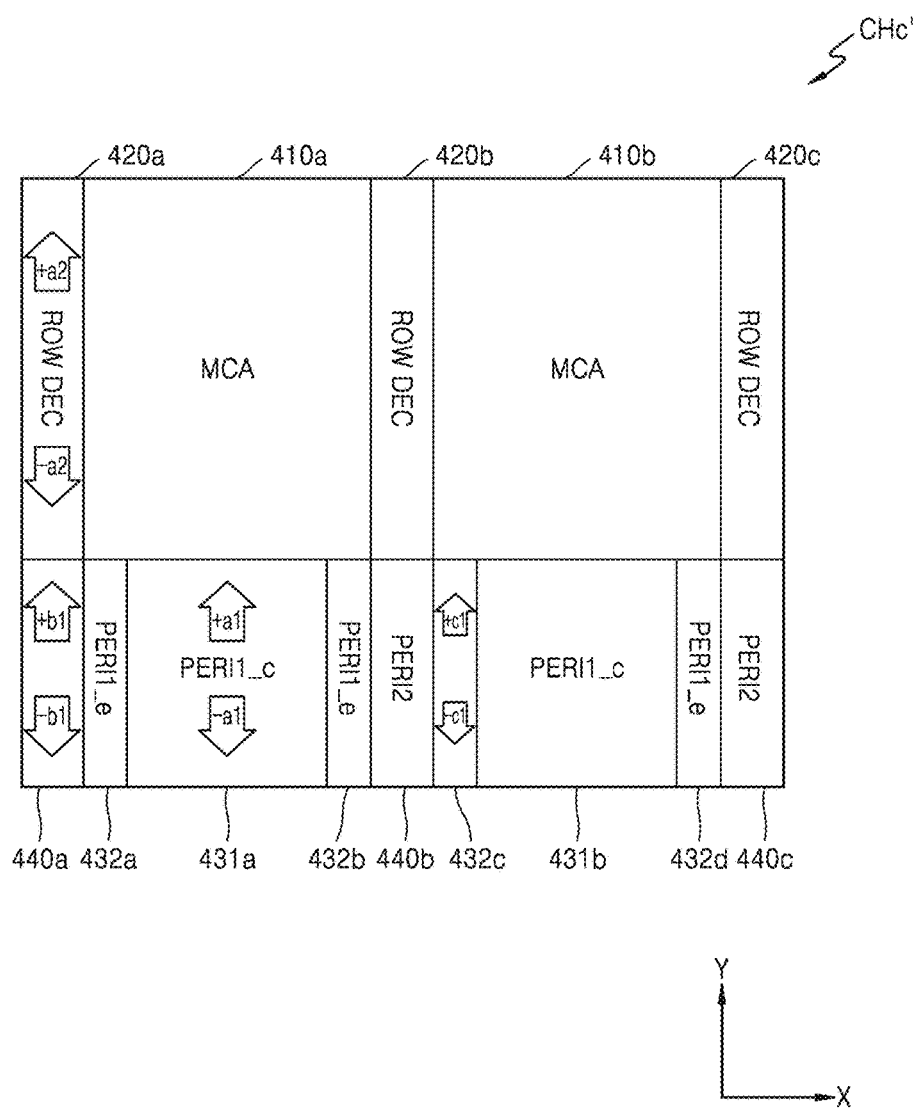

Referring to FIG. 17B, the stacked memory device may be implemented in a semiconductor chip CHc'. The semiconductor chip CHc' according to the present embodiment is a modified embodiment of the semiconductor chip CHc of FIG. 17*a*, and only the difference therebetween will be mainly described below.

In the present embodiment, the shift values for the first patterns arranged in the row decoder areas 420*a* to 420*c* may be calculated by applying the first calculation equation to the row decoder areas 420*a* to 420*c*. That is, the calculation equations applied to calculate shift values may be determined based on the Y coordinates, irrespective of the X coordinates. For example, while taking the first reference line according to the Y coordinates as the center, the shift values for the first patterns arranged above the first reference line in the row decoder areas 420*a* to 420*c* may be determined by +a2. The shift values for the first patterns arranged below the first reference line in the row decoder areas 420*a* to 420*c* may be determined by −a2. For example, the first calculation equation may be implemented by a linear function.

FIG. 18 is sectional views illustrating stacked memory devices according to an embodiment.

Referring to FIG. 18, the stacked memory device 500 corresponds to an ideal case manufactured according to the initial layout. Assuming that a peripheral circuit area 510*b* is not shifted due to the mold stress or channel hole stress caused by the cell array forming process, the gate contact 530 may be aligned with a gate electrode 520 of a transistor TR.

The stacked memory device 500*a* corresponds to an actual case manufactured according to the initial layout without performing the OPC verification (for example, the method of FIG. 9) according to an embodiment. Due to the mold stress or channel hole stress caused by the cell array forming process, the transistor TR arranged in the peripheral circuit area 510*b* may be shifted towards the memory cell array area 510*a* by d1 as compared with the stacked memory device 500. Accordingly, the gate contact 530 may be misaligned from the gate electrode 520*a* of the transistor TR.

The stacked memory device 500*b* corresponds to a case manufactured by performing the OPC verification (for example, the method of FIG. 9) according to an embodiment. According to the present embodiment, a determination whether the OPC is to be performed again may be made by calculating a shift value of a contact pattern corresponding to the gate contact 530*b* in advance, and comparing the difference values and shift values of the contact pattern of the initial layout and the contact pattern for which the OPC has been performed. Accordingly, the corrected contact pattern may be shifted towards the memory cell array area 510*a* by d1 as compared with the contact pattern of the initial layout. When the gate contact 530*b* is formed by using a mask manufactured according to the corrected contact pattern, the gate contact 530*b* may be aligned with the gate electrode 520*b* even though it is formed after a cell array forming process.

Figure 19:
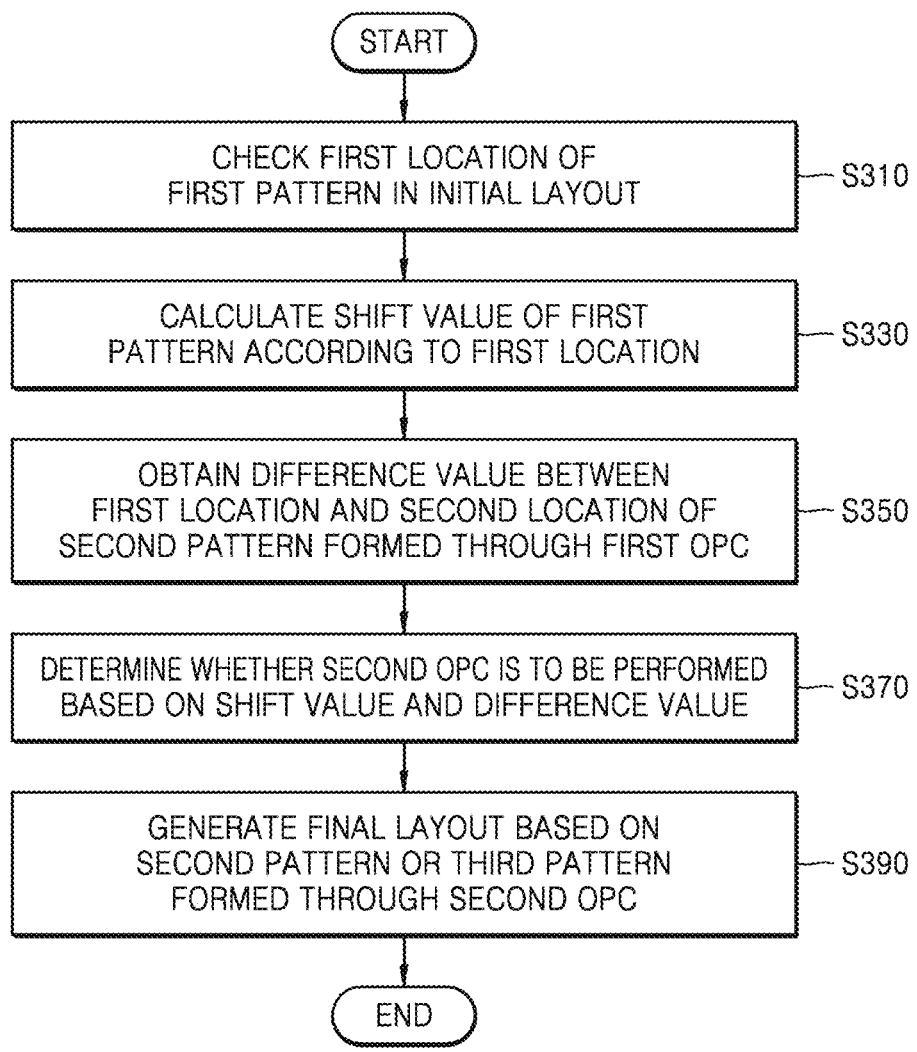
FIG. 19 is a flowchart of a method of designing a layout of a stacked memory device according to an embodiment.

FIG. 19 is a flowchart of a method of designing a layout of a stacked memory device according to an embodiment.

Referring to FIG. 19, in operation S310, a first location of a first pattern in an initial layout of a stacked memory device is checked. In operation S330, a shift value of a first pattern is calculated according to the first location. In operation S350, a difference value between a second location of a second pattern obtained through a first OPC and the first location is obtained. An operation of performing the first OPC with respect to the first pattern may be further included between operation S330 and operation S350.

In operation S370, it is determined whether or not a second OPC is to be performed, based on a shift value and a difference value. In operation S390, a final layout is formed, based on the second pattern or a third pattern formed through the second OPC. An operation of performing the second OPC with respect to the second pattern may be further included between operation S370 and operation S380.

Figure 20:
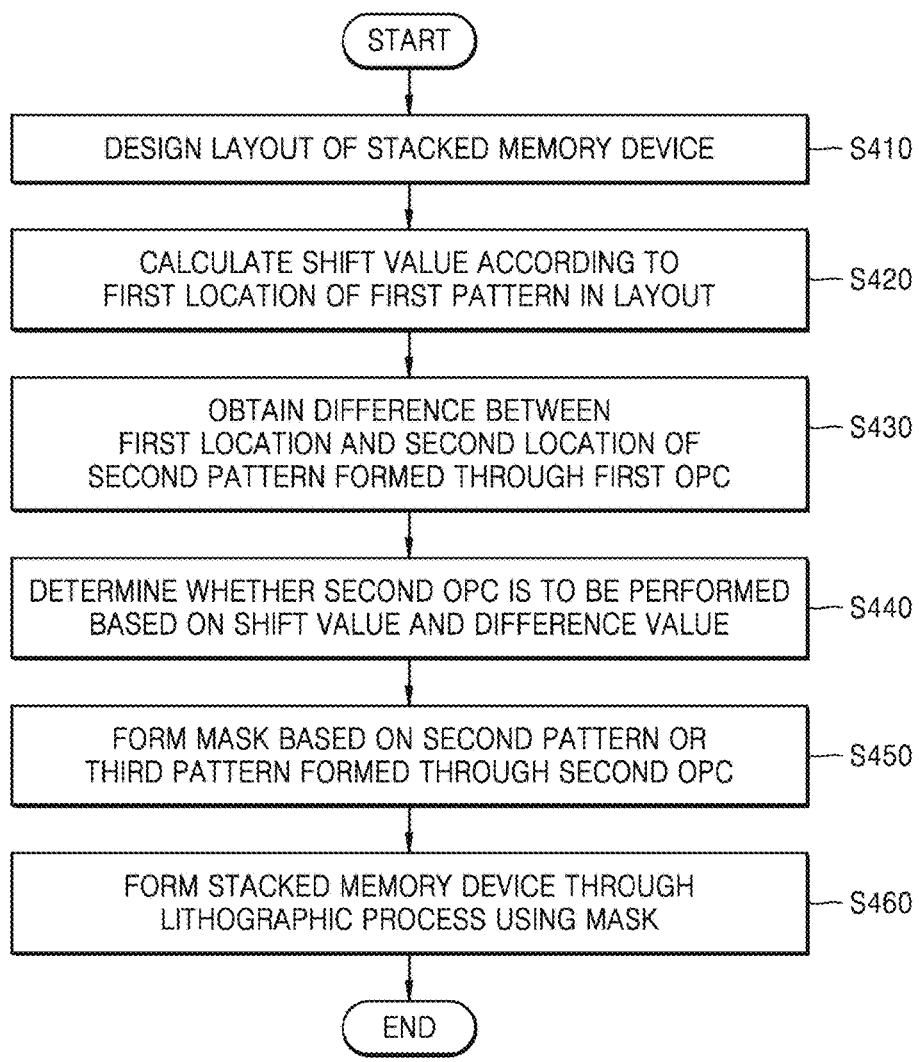
FIG. 20 is a flowchart of a method of manufacturing a stacked memory device according to an embodiment.

FIG. 20 is a flowchart of a method of manufacturing a stacked memory device according to an embodiment.

Referring to FIG. 20, in operation S410, a layout of a stacked memory device is designed. In operation S420, a shift value of a first pattern is calculated according to a first location of the first pattern in a layout of the stacked memory device. In operation S430, a difference value between a second location of a second pattern formed through a first OPC and the first location is obtained. An operation of performing the first OPC with respect to the first pattern may be further included between operation S420 and operation S430.

In operation S440, it is determined whether or not a second OPC is to be performed, based on a shift value and a difference value. In operation S450, a mask is formed, based on the second pattern or a third pattern formed through the second OPC. An operation of performing the second OPC with respect to the second pattern may be further included between operation S420 and operation S430. In operation S460, the stacked memory device is formed through a lithographic process using a mask.

Figure 21:
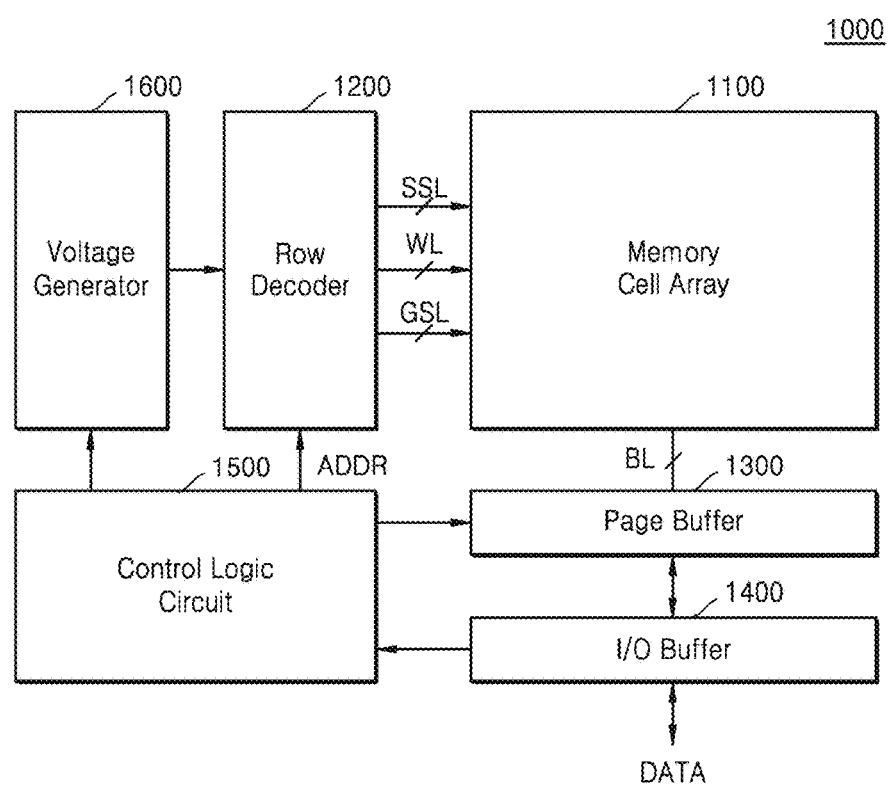
FIG. 21 is a block diagram of a stacked memory device according to some embodiments.

FIG. 21 is a block diagram of a stacked memory device 1000 according to some embodiments.

Referring to FIG. 21, the stacked memory device 1000 may include a memory cell array 1100, a row decoder 1200, a page buffer 1300, an input/output buffer 1400, a control logic circuit 1500, and a voltage generator 1600. The peripheral circuits such as the row decoder, the page buffer 1300, the input/output buffer 1400, the control logic circuit 1500, and the voltage generator 1600 may be arranged adjacent to the memory cell array 1100 in a first direction.

In an embodiment, the first direction may correspond to the Y direction of FIG. 2. The peripheral circuit may include multiple transistors electrically connected to the memory cell array 1100. When the stacked memory device 1000 is manufactured through the method of FIG. 1, 9, 19, or 20, the locations in the first direction of the contacts connected to first transistors of the multiple transistors may be substantially the same. Distances of the first transistors from the memory cell array 1100 may be the same. For example, the contacts may be gate contacts respectively connected to the gate electrodes of the transistors. According to the present embodiment, the gate electrodes may be aligned with the corresponding gate contacts.

In an embodiment, the first direction may correspond to the Y direction of FIG. 2. The peripheral circuit may include transistors electrically connected to a first area of the memory cell array 1100, and transistors electrically connected to a second area of the memory cell array 1100. Here, although the memory cell array 1100 is divided into two areas, the memory cell array 1100 is not limited thereto, and the memory cell array 1100 may be divided into three or more areas. Accordingly, the peripheral circuit also may be divided into three or more areas. When the stacked memory device 1000 is manufactured through the method of FIG. 1, 9, 19, or 20, first locations in the first direction of first contacts connected to first transistors of the transistors electrically connected to the first area may be substantially the same. Distances of the first transistors from the memory cell array 1100 may be the same. Further, second locations of second contacts connected to second transistors of the transistors electrically connected to the second area may be substantially the same. Distances of the second transistors from the memory cell array 1100 may be the same.

For example, the first direction may correspond to the Y direction of FIG. 2, the first area of the memory cell array 1100 may be a central area, and the second area of the memory cell array 1100 may be an edge area. Then, the peripheral circuit may include central transistors electrically connected to the central area of the memory cell array 1100, and edge transistors electrically connected to the edge area of the memory cell array 1100. When the stacked memory device 1000 is manufactured through the method of FIG. 1, 9, 19, or 20, first locations in the first direction of first contacts connected to first transistors of the central transistors may be substantially the same. Distances of the first transistors from the memory cell array 1100 may be the same. Further, second locations of second contacts connected to second transistors of the edge transistors may be substantially the same. Distances of the second transistors from the memory cell array 1100 may be the same.

When the distance from the memory cell array 1100 to the first transistors and the distance from the memory cell array 1100 to the second transistors are the same, the first and second locations may be different. For example, the first contacts may be first gate contacts respectively connected to the first gate electrodes of the first transistors. The second contacts may be second contacts respectively connected to the second gate electrodes of the second transistors. According to the present embodiment, the first gate electrodes may be respectively aligned with the corresponding gate contacts, and the second gate electrodes may be respectively aligned with the corresponding second gate contacts.

In an embodiment, the first direction may correspond to the X direction of FIG. 2. The peripheral circuit may include multiple transistors electrically connected to the memory cell array 1100. When the stacked memory device 1000 is manufactured through the method of FIG. 1, 9, 19, or 20, first locations of first contacts connected to first transistors of the multiple transistors may be substantially the same. The first locations of the first contacts along the Y direction may be the same. For example, the contacts may be gate contacts respectively connected to the gate electrodes of the transistors. According to the present embodiment, the gate electrodes may be aligned with the corresponding gate contacts.

The memory cell array 1100 may be arranged in the memory cell array area (for example, 110a and 110a' of FIGS. 2, 210a and 210b of FIGS. 10, 410a and 410b of FIGS. 15A to 17B, or 510a of FIG. 18). The row decoder 1200, the page buffer 1300, the input/output buffer 1400, the control logic circuit 1500, or the voltage generator 1600 may be arranged in the peripheral circuit area (for example, PA of FIG. 2, 230 of FIGS. 10, 430a, 430b, 440a to 440c, 431a, 431b, and 432a to 432d of FIGS. 15A to 17B, or 510b of FIG. 18).

Although the embodiment has been described above with reference to the accompanying drawings, it should be understood that these embodiments are given by way of illustration only, and that various modifications, variations, and alterations can be made without departing from the spirit and scope of the present disclosure. Hence, the true technical scope of the present disclosure will be determined by the technical spirit of the claims.

What is claimed is:

1. A method of manufacturing a stacked memory device, the method comprising:
   designing a layout of the stacked memory device, the layout including a first pattern;
   calculating value of shift of the first pattern according to a first location of the first pattern in the layout;
   obtaining a difference value between the first location of the first pattern and a second location of a second pattern formed through a first optical proximity correction (OPC) with respect to the first pattern;
   determining, by a processor that executes software instructions, whether a second OPC is to be performed, based on the value of shift and the difference value;
   when the processor determines that the second OPC is to be performed, forming a third pattern through the second OPC;
   forming a mask, based on the second pattern or third pattern formed through the second OPC; and
   forming the stacked memory device through a lithographic process using the mask.

2. The method of claim 1, wherein the stacked memory device comprises a memory cell array area and a peripheral circuit area that is adjacent to the memory cell array area in a first direction, and the first pattern comprises a contact pattern arranged in the peripheral circuit area.

3. The method of claim 2, wherein the first location comprises a Y coordinate of the first pattern along the first direction.

4. The method of claim 3, wherein the calculating of the value of shift comprises calculating the value of shift such that at least one of a shift direction and a shift amount of the first pattern varies according to the Y coordinate.

5. The method of claim 4, wherein the calculating of the value of shift comprises:
   selecting one of a plurality of equations as a selected equation according to the Y coordinate; and
   calculating the value of shift using the selected equation.

6. The method of claim 3, wherein the obtaining of the difference value comprises obtaining a difference value between a first Y coordinate corresponding to the first location and a second Y coordinate corresponding to the second location.

7. The method of claim 2, wherein the first location comprises a Y coordinate of the first pattern along the first direction and an X coordinate of the first pattern along a second direction, and the second direction is substantially perpendicular to the first direction.

8. The method of claim 7, wherein the calculating of the value of shift comprises:
   selecting one of a plurality of equations as a selected equation according to the X coordinate; and
   calculating the value of shift using the selected equation.

9. The method of claim 7, wherein the calculating of the value of shift comprises:
   selecting one of a plurality of equations as a selected equation according to the X coordinate and the Y coordinate; and
   calculating the value of shift by using the selected equation.

10. The method of claim 7, wherein the stacked memory device further comprises a row decoder area that is adjacent to the memory cell array area in the second direction,
    wherein the peripheral circuit area comprises a first peripheral circuit area adjacent to the memory cell array area and a second peripheral circuit area adjacent to the row decoder area, and wherein the calculating of the value of shift comprises:
    when the X coordinate is in the first peripheral circuit area, calculating the value of shift according to the Y coordinate by using a first calculation equation; and
    when the X coordinate is in the second peripheral circuit area, calculating the value of shift according to the Y coordinate by using a second calculation equation.

11. The method of claim 10, wherein the calculating of the value of shift further comprises, when the Y coordinate is in the row decoder area, calculating the value of shift according to the Y coordinate by using a third calculation equation.

12. The method of claim 7, wherein the stacked memory device further comprises a row decoder area that is adjacent to the memory cell array area in the second direction,
    wherein the peripheral circuit area comprises a first central peripheral circuit area adjacent to a central area of the memory cell array area, a first edge peripheral circuit area adjacent to an edge area of the memory cell array area, and a second peripheral circuit area adjacent to the row decoder area, and
    wherein the calculating of the value of shift comprises:
    when the X coordinate is in the first central peripheral circuit area, calculating the value of shift according to the Y coordinate by using a first calculation equation;
    when the X coordinate is in the first edge peripheral circuit area, calculating the value of shift according to the Y coordinate by using a second calculation equation; and
    when the X coordinate is in the second peripheral circuit area, calculating the value of shift according to the Y coordinate by using a third calculation equation.

13. The method of claim 12, wherein the calculating of the value of shift further comprises, when the Y coordinate is in the row decoder area, calculating the value of shift according to the Y coordinate by using a fourth calculation equation.

14. The method of claim 7, wherein the obtaining of the difference value comprises obtaining a difference value between a first Y coordinate corresponding to the first location and a second Y coordinate corresponding to the second location.

15. The method of claim 2, further comprising, before the difference value is obtaining, performing the OPC with respect to the first pattern, and wherein the performing of the OPC comprises forming the second pattern by shifting the first pattern according to the first location such that the first pattern becomes close to the memory cell array area or distant from the memory cell array area.

16. The method of claim 1, wherein the determining of whether the second OPC is to be performed again comprises:
    determining whether the second pattern is within a tolerance, based on directions and sizes of the value of shift and the difference value;
    if the second pattern is within the tolerance, determining that the second OPC is not to be performed; and
    if the second pattern deviates from the tolerance, determining that the second OPC is to be performed.

17. The method of claim 2, wherein the forming of the mask comprises forming a mask for forming a contact according to the contact pattern.

18. The method of claim 17, wherein the forming of the stacked memory device comprises:
    forming a transistor in the peripheral circuit area;
    forming a plurality of memory cells in the memory cell array area; and
    forming the contact connected to the transistor, through the lithographic process using the mask.

* * * * *